(12) United States Patent
Daniels

(10) Patent No.: US 11,728,673 B2
(45) Date of Patent: *Aug. 15, 2023

(54) ADVANCED SMART BATTERY ANALYTIC AND DIAGNOSTIC SYSTEMS AND METHODS

(71) Applicant: SCHNEIDER ELECTRIC IT CORPORATION, Foxboro, MA (US)

(72) Inventor: Scott Lee Daniels, Burlington, MA (US)

(73) Assignee: SCHNEIDER ELECTRIC IT CORPORATION, Foxboro, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/652,525

(22) Filed: Feb. 25, 2022

(65) Prior Publication Data

US 2022/0376544 A1 Nov. 24, 2022

Related U.S. Application Data

(63) Continuation of application No. 16/459,997, filed on Jul. 2, 2019, now Pat. No. 11,283,283.

(60) Provisional application No. 62/693,678, filed on Jul. 3, 2018.

(51) Int. Cl.
*H02J 9/00* (2006.01)
*G01R 31/392* (2019.01)
(Continued)

(52) U.S. Cl.
CPC .............. *H02J 9/00* (2013.01); *G01R 31/392* (2019.01); *H01M 10/4257* (2013.01);
(Continued)

(58) Field of Classification Search
CPC .......... H02J 9/00; H02J 7/0047; H02J 7/0048; G01R 31/392; H01M 10/4257; H01M 2010/4271
See application file for complete search history.

(56) References Cited

U.S. PATENT DOCUMENTS 5,978,236 A  11/1999  Faberman et al.
7,411,315 B2  8/2008  Gottlieb et al.
(Continued)

FOREIGN PATENT DOCUMENTS

CN  103760494 A  4/2014
CN  105283773 A  1/2016
(Continued)

OTHER PUBLICATIONS

Extended European Search Report from corresponding European Application No. 19182229.5 dated Nov. 11, 2019.

*Primary Examiner* — Carlos Amaya
(74) *Attorney, Agent, or Firm* — Lando & Anastasi, LLP

(57) ABSTRACT

An uninterruptible power supply (UPS) is provided including an interface to receive first sensor data indicative of operating information of a battery and second sensor data indicative of state-of-health characteristics of the battery from one or more sensors, and configured to communicate with a computer coupled to a plurality of UPSs, and a controller configured to receive the first sensor data, provide the first sensor data to the computer, receive an estimated battery health status (EBHS) of the battery based on the first sensor data and baseline battery health characteristics from the computer, receive the second sensor data from the one or more sensors, determine an actual battery health status (ABHS) of the battery based on the second sensor data, compare the EBHS and the ABHS, and communicate information to the computer to adjust the baseline battery health characteristics based on the comparison of the EBHS and the ABHS.

24 Claims, 7 Drawing Sheets

(51) Int. Cl.
 *H01M 10/42* (2006.01)
 *H02J 7/00* (2006.01)
 *H01M 10/48* (2006.01)

(52) U.S. Cl.
 CPC ......... *H01M 10/48* (2013.01); *H01M 10/482* (2013.01); *H01M 10/486* (2013.01); *H01M 10/488* (2013.01); *H02J 7/0047* (2013.01); *H01M 2010/4271* (2013.01); *H02J 7/0048* (2020.01)

(56) References Cited

U.S. PATENT DOCUMENTS

| | | |
|---|---|---|
| 8,407,018 B2 | 3/2013 | White et al. |
| 9,207,285 B1 | 12/2015 | Swanton et al. |
| 10,014,561 B2 | 7/2018 | Sood et al. |
| 11,283,283 B2 * | 3/2022 | Daniels .................. H02J 9/00 |
| 2010/0121587 A1 | 5/2010 | Vian et al. |
| 2012/0150464 A1 | 6/2012 | Swanton |
| 2014/0089692 A1 | 3/2014 | Hanafusa |
| 2015/0046109 A1 | 2/2015 | Miwa et al. |
| 2015/0333554 A1 | 11/2015 | Cohen et al. |
| 2017/0054317 A1 | 2/2017 | Katsuki et al. |
| 2018/0123357 A1 | 5/2018 | Beaston et al. |
| 2018/0188328 A1 | 7/2018 | Hsieh et al. |
| 2018/0217208 A1 | 8/2018 | Park et al. |
| 2019/0196575 A1 | 6/2019 | Grobelny et al. |

FOREIGN PATENT DOCUMENTS

| | | |
|---|---|---|
| JP | 2014013245 A | 1/2014 |
| WO | 2013152397 A1 | 10/2013 |
| WO | 2016059126 A1 | 4/2016 |

* cited by examiner

ADVANCED SMART BATTERY ANALYTIC AND DIAGNOSTIC SYSTEMS AND METHODS

CROSS-REFERENCE TO RELATED APPLICATIONS

This application is a Continuation of U.S. application Ser. No. 16/459,997, titled ADVANCED SMART BATTERY ANALYTIC AND DIAGNOSTIC SYSTEMS AND METHODS, filed on Jul. 2, 2019, which claims priority under 35 U.S.C. § 119(e) to U.S. Provisional Application Ser. No. 62/693,678, titled ADVANCED SMART BATTERY ANALYTIC AND DIAGNOSTIC SYSTEMS AND METHODS, filed on Jul. 3, 2018, both of which are hereby incorporated herein by reference in their entirety for all purposes.

BACKGROUND OF THE INVENTION

The capacity of the one or more batteries in a battery-based energy storage device, such as an uninterruptible power supply (UPS), may vary in accordance with a variety of factors. For instance, these factors may include temperature, age, and load, to name a few examples. As the one or more batteries age, they are preferably replaced when their capacity drops below a desired level of performance (for example, a desired runtime). In most cases, it is desirable to replace the batteries before their diminished capacity affects the operation of one or more devices or systems that rely on the battery for primary power or back-up power. Accordingly, to determine when a battery capacity has dropped below a desired level of performance, one or more periodic tests may be performed on the one or more batteries.

SUMMARY

Aspects and embodiments are generally directed to battery health diagnostic and analytic systems for uninterruptible power supplies (UPSs) and other advanced battery-based energy storage devices, and related methods. Particular examples of the battery health diagnostic and analytic systems ("battery health systems") described herein communicate with one or more smart stationary batteries to monitor operating conditions and operating characteristics, determine an actual battery health status of the one or more smart stationary batteries, and baseline characteristics for the one or more smart stationary batteries and/or one or more smart stationary batteries.

In the various examples described herein, the battery health systems leverage data logging and self-reporting features of smart stationary batteries to learn, predict, and generate one or more indications of an overall health of the smart stationary batteries. Further examples may also generate one or more indications of a reliability and/or safety of the smart stationary batteries, and/or one or more indications of a remaining life of the smart stationary batteries. In addition to fundamentally improving the efficiency, accuracy, and safety of typical battery health monitoring approaches and techniques, various other advantages and benefits of the battery health systems and methods are described herein with reference to the drawings.

According to various aspects, provided is an uninterruptible power supply. One example of an uninterruptible power supply may comprise an input to receive input power, a smart battery configured to provide battery power, an output to provide output power derived from at least one of the input power and the battery power, an interface configured to receive sensor data indicative of operating conditions and operating characteristics of the smart battery, and a controller coupled to at least the interface. The controller is configured to determine an estimated battery health status of the smart battery based on baseline characteristics for the smart battery, the baseline characteristics being derived from manufacturer specifications for the smart battery, determine an actual battery health status of the smart battery based on the operating conditions and the operating characteristics of the smart battery, compare the estimated battery health status and the actual battery health status of the smart battery, and adjust the baseline characteristics for the smart battery based at least in part on the comparison of the estimated battery health status and the actual battery health status.

According to various examples, the uninterruptible power supply may further comprise a communication interface further configured to receive an update to the baseline characteristics of the smart battery, the update being based at least in part on adjustments to baseline characteristics for another smart battery. In various examples, the communication interface is further configured to communicate with a local server, the communication interface being further configured to transmit the adjustment to the baseline characteristics for the smart battery to the local server. In some examples, the estimated battery health status includes an estimated remaining charge capacity of the smart battery and the actual battery health status includes an actual remaining charge capacity of the smart battery, the controller further configured to generate an alarm if the estimated remaining charge capacity exceeds the actual remaining charge capacity.

According to various aspects, provided is a method of providing battery health status information. In one example, the method may comprise determining an estimated battery health status of at least a first smart stationary battery based on baseline characteristics for the first smart stationary battery, the baseline characteristics being derived from manufacturer specifications for the first smart stationary battery, receiving, from the first smart stationary battery, operating conditions and operating characteristics of the first smart stationary battery, determining an actual battery health status of the first smart stationary battery based on the received operating conditions and the operating characteristics of the first smart stationary battery, comparing the estimated battery health status and the actual battery health status of the first smart stationary battery, and adjusting the baseline characteristics for the first smart stationary battery based at least in part on the comparison of the estimated battery health status and the actual battery health status.

According to various examples, the method further comprises adjusting baseline characteristics for a second smart stationary battery based on the adjustment to the baseline characteristics for the first smart stationary battery. In some examples, the first smart stationary battery is located within a local battery network and the second smart stationary battery is located within an external battery network geographically distinct from the local battery network. In various examples, the method further comprises transmitting the adjustment to the baseline characteristics of the first smart stationary battery to a cloud service, and adjusting the baseline characteristics for the second smart stationary battery includes adjusting the baseline characteristics for the second smart stationary battery at the cloud service. In at least one example, the method further comprises storing the operating conditions and the operating characteristics of the first smart stationary battery at the cloud service. In some examples, the method further comprises receiving, from the cloud service, an update to the baseline characteristics for the first smart stationary battery based at least in part on adjustments to baseline characteristics for a third smart stationary battery, the third smart stationary battery being located within the external battery network.

According to various examples, the first smart stationary battery and the second smart stationary battery are co-located within a local battery network. In various examples, the method further comprises determining an updated estimated battery health status of the first smart stationary battery based on the adjustment to the baseline characteristics. In some examples, at least the first smart stationary battery is a lithium-ion battery.

In various examples, the estimated battery health status includes an estimated remaining charge capacity of the first smart stationary battery and the actual battery health status includes an actual remaining charge capacity of the first smart stationary battery, and the method further comprises generating an alarm if the estimated remaining charge capacity exceeds the actual remaining charge capacity. In some examples, the method further comprises receiving operating conditions and operating characteristics of a second smart stationary battery, wherein the operating conditions and operating characteristics of the second smart stationary battery comply with manufacturer usage restrictions for the first smart stationary battery, determining an actual battery health status of the second smart stationary battery based on the received operating conditions and the operating characteristics of the second smart stationary battery, and comparing the actual battery health status of the first smart stationary battery and actual battery health status of the second smart stationary to validate the operating conditions and operating characteristics of the first smart stationary battery comply with manufacturer usage restrictions.

According to various aspects, provided is a battery health status diagnostic system. One example of the battery health status diagnostic system may comprise a memory, an interface component configured to receive, via a network connection, operating conditions and operating characteristics of at least a first smart stationary battery, at least one processor coupled to the memory and the interface component, a battery health estimate component executable by the at least one processor and configured to determine an estimated battery health status of the first smart stationary battery based on baseline characteristics for the first smart stationary battery, the baseline characteristics being derived from manufacturer specifications for the first smart stationary battery, and a battery health interpolation component executable by the at least one processor. The battery health interpolation component is configured to determine an actual battery health status of the first smart stationary battery based on the received operating conditions and the operating characteristics of the first smart stationary battery, compare the estimated battery health status and the actual battery health status of the first smart stationary battery, and adjust the baseline characteristics for the first smart stationary battery based at least in part on the comparison of the estimated battery health status and the actual battery health status.

According to various examples, the battery health interpolation component is further configured to adjust baseline characteristics for a second smart stationary battery based on the adjustment to the baseline characteristics for the first smart stationary battery. In various examples, the interface component is further configured to receive an update to the baseline characteristics for the first smart stationary battery based at least in part on adjustments to baseline characteristics for a second smart stationary battery, the second smart stationary battery being located within an external battery network. In some examples, the estimated battery health status includes an estimated remaining charge capacity of the first smart stationary battery and the actual battery health status includes an actual remaining charge capacity of the first smart stationary battery, the battery health status diagnostic system further comprising an alarm component executable by the at least one processor and configured to generate an alarm if the estimated remaining charge capacity exceeds the actual remaining charge capacity.

In various examples, the interface component is further configured to receive operating conditions and operating characteristics of a second smart stationary battery, wherein the operating conditions and operating characteristics of the second smart stationary battery comply with manufacturer usage restrictions for the first smart stationary battery, wherein the battery health estimate component is further configured to determine an actual battery health status of the second smart stationary battery based on the received operating conditions and the operating characteristics of the second smart stationary battery, and wherein the battery health interpolation component is further configured to compare the actual battery health status of the first smart stationary battery and the actual battery health status of the second smart stationary to validate the operating conditions and operating characteristics of the first smart stationary battery comply with manufacturer usage restrictions.

According to various examples, a non-transitory computer-readable medium storing thereon sequences of computer-executable instructions for controlling a computer system configured to be communicatively coupled to a plurality of power devices each being configured to be coupled to a respective battery is provided, the sequences of computer-executable instructions including instructions that instruct at least one processor to receive actual battery health data from a first power device of the plurality of power devices, the actual battery health data being indicative of an actual battery health status of a first battery coupled to the first power device, adjust stored baseline battery health characteristics based at least in part on the actual battery health status to generate adjusted stored baseline battery health characteristics, receive sensor data from a second power device of the plurality of power devices, the sensor data being indicative of operating information of a second battery coupled to the second power device, determine an estimated battery health status of the second battery based on the sensor data and the adjusted stored baseline battery health characteristics, and output the estimated battery health status of the second battery.

In some examples, in instructing the at least one processor to adjust the stored baseline battery health characteristics, the instructions further instruct the at least one processor to receive second sensor data from the first power device, the second sensor data being indicative of operating information of the first battery, and determine an estimated battery health status of the first battery based on the second sensor data and the stored baseline battery health characteristics, wherein generating the adjusted stored baseline battery health characteristics is based on a difference between the estimated battery health status of the first battery and the actual battery health data. In at least one example, the estimated battery health status of the first battery includes an estimated remaining charge capacity of the first battery and the actual battery health status includes an actual remaining charge capacity of the first battery, and wherein the instructions are further configured to instruct the at least one processor to generate an output if the estimated remaining charge capacity of the first battery exceeds the actual remaining charge capacity of the first battery.

In some examples, the instructions are further configured to instruct the at least one processor to receive second actual battery health data from the second power device, the second actual battery health data being indicative of an actual battery health status of the second battery, compare the actual battery health status of the second battery to the estimated battery health status of the second battery to determine whether the actual battery health status of the second battery is less than the estimated battery health status of the second battery, and generate an output indicative of the actual battery health status of the second battery being less than the estimated battery health status of the second battery. In at least one example, the instructions are further configured to instruct the at least one processor to compare, responsive to determining that the actual battery health status of the second battery is less than the estimated battery health status of the second battery, the actual battery health status of the first battery to the actual battery health status of the second battery to determine whether the actual battery health status of the second battery is less than the actual battery health status of the first battery, and generate an output indicative of the actual battery health status of the second battery being less than the actual battery health status of the first battery.

In some examples, the instructions are further configured to instruct the at least one processor to determine, responsive to determining that the actual battery health status of the second battery is less than the actual battery health status of the first battery, that the second battery is defective, and generate, based on the determination that the second battery is defective, an output indicative of the second battery being defective. In at least one example, the instructions are further configured to instruct the at least one processor to determine, responsive to determining that the actual battery health status of the second battery is less than the estimated battery health status of the second battery, whether the operating information of the second battery complies with manufacturer usage restrictions for the second battery, and generate an output indicating that the operating information of the second battery does not comply with the manufacturer usage restrictions for the second battery.

In some examples, the instructions are further configured to instruct the at least one processor to compare, responsive to determining that the operating information of the second battery does not comply with manufacturer usage restrictions for the second battery, the actual battery health status of the first battery to the actual battery health status of the second battery to validate the manufacturer usage restrictions for the second battery, wherein operating information of the first battery complies with the manufacturer usage restrictions for the second battery, and generate, responsive to validating the manufacturer usage restrictions for the second battery, an output indicating that the actual battery health status of the second battery is less than the estimated battery health status of the second battery due to the operating information of the second battery not complying with the manufacturer usage restrictions for the second battery.

According to various examples, an uninterruptible power supply is provided comprising an input to receive input power, a battery input to receive battery power from a battery, an output to provide output power derived from at least one of the input power or the battery power, at least one interface configured to receive first sensor data indicative of operating information of the battery and second sensor data indicative of state-of-health characteristics of the battery from one or more sensors, and configured to communicate with a computer system coupled to a plurality of uninterruptible power supplies, and a controller coupled to at least the interface, the controller configured to receive the first sensor data from the one or more sensors, provide the first sensor data to the computer system, receive an estimated battery health status of the battery from the computer system, the estimated battery health status being based on the first sensor data and baseline battery health characteristics stored by the computer system, receive the second sensor data from the one or more sensors, determine an actual battery health status of the battery based on the second sensor data, compare the estimated battery health status and the actual battery health status of the battery, and communicate adjustment information to the computer system to adjust the baseline battery health characteristics based at least in part on the comparison of the estimated battery health status and the actual battery health status.

In some examples, the estimated battery health status includes an estimated remaining charge capacity of the battery and the actual battery health status includes an actual remaining charge capacity of the battery, the controller further configured to generate an output if the estimated remaining charge capacity exceeds the actual remaining charge capacity. In at least one example, the controller is further configured to provide manufacturer specification information corresponding to the battery to the computer system. In various examples, the manufacturer specification information includes an estimated calendar life and an estimated cycle life.

In at least one example, the operating characteristics include at least one of current characteristics, voltage characteristics, power characteristics, duty cycle characteristics, depth of discharge characteristics, rate of discharge characteristics, or rate of charge characteristics. In some examples, the operating conditions include one or more of battery temperature characteristics, battery cell temperature characteristics, cycle timing characteristics, or humidity characteristics. In at least one example, the estimated battery health status of the battery includes an estimated remaining life. In various examples, the second sensor data includes depletion test information.

According to various examples, a system is provided comprising a plurality of power devices, each power device of the plurality of power devices being configured to be coupled to a respective battery, and a server comprising a communication interface and at least one processor, the at least one processor being configured to receive actual battery health data from a first power device of the plurality of power devices, the actual battery health data being indicative of an actual battery health status of a first battery coupled to the first power device, adjust stored baseline battery health characteristics based at least in part on the actual battery health status to generate adjusted stored baseline battery health characteristics, receive sensor data from a second power device of the plurality of power devices, the sensor data being indicative of operating information of a second battery coupled to the second power device, determine an estimated battery health status of the second battery based on the sensor data and the adjusted stored baseline battery health characteristics, and output the estimated battery health status of the second battery.

In at least one example, the first power device includes at least one interface configured to receive second sensor data indicative of state-of-health characteristics of the first battery from one or more sensors, and configured to communicate with the server, and a controller coupled to the at least one interface, the controller configured to receive the second sensor data from the one or more sensors, determine the actual battery health status of the first battery based on the second sensor data, and transmit the actual battery health data to the server. In some examples, the at least one controller is further configured to receive sensor data from the first power device, the sensor data from the first power device being indicative of operating information of the first power device, and determine an estimated battery health status of the first power device based on the sensor data from the first power device and the stored baseline battery health characteristics, wherein generating the adjusted stored baseline battery health characteristics is based on a difference between the estimated battery health status of the first battery and the actual battery health status.

In some examples, the second power device includes at least one interface configured to receive the sensor data from one or more sensors and second sensor data indicative of state-of-health characteristics of the second battery from the one or more sensors, and configured to communicate with the server, and at least one processor configured to control the first power device to receive the sensor data from the one or more sensors, provide the sensor data to the server, receive the estimated battery health status of the second battery from the server, receive the second sensor data from the one or more sensors, determine an actual battery health status of the second battery based on the second sensor data, compare the estimated battery health status of the second battery and the actual battery health status of the second battery, and generate an output responsive to determining that the actual battery health status of the second battery is less than the estimated battery health status of the second battery.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
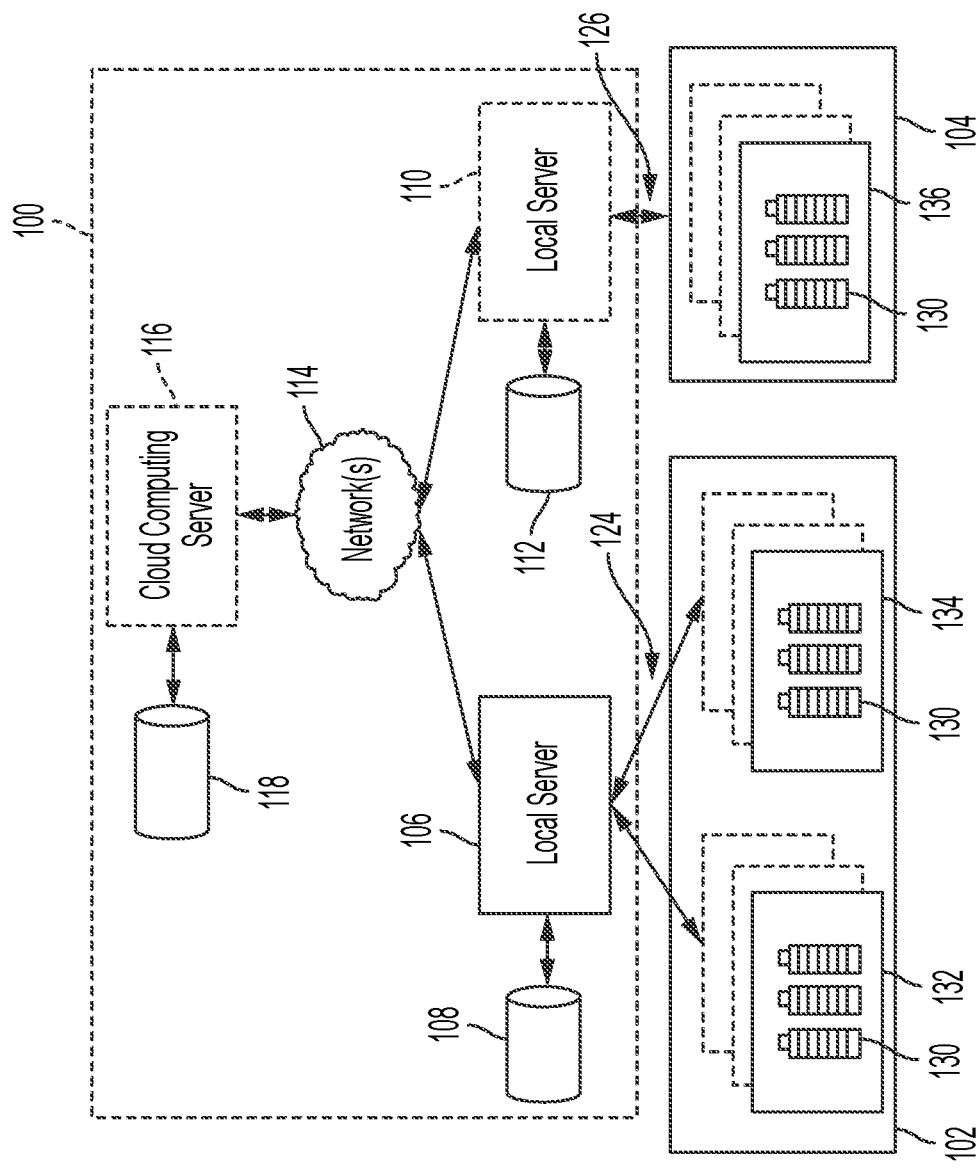
FIG. 1 is a block diagram of a battery health system coupled to one or more smart stationary battery networks, according to various examples described herein.

Aspects and embodiments are generally directed to battery health diagnostic and analytic systems for uninterruptible power supplies (UPSs) and other battery-based energy storage devices. Particular examples of the battery health diagnostic and analytic systems described herein (also generally referred to as "battery health systems") may communicate with one or more local smart stationary batteries and/or one or more remote smart stationary batteries to aggregate corresponding operating conditions, operating characteristics, and state-of-health (SoH) information. Based on the received information, the battery health systems may monitor the performance of the local or remote smart stationary batteries, and may update baseline characteristics for those local or external smart stationary batteries and similar smart stationary batteries. Among other information, baseline characteristics may be used by the battery health system to determine remaining battery life, detect early stage defects in smart stationary batteries, detect misuse, provide real-time performance diagnostics, and/or provide one or more real-time battery health status notifications.

As discussed above, battery health is typically monitored by performing one or more periodic tests. If the battery or batteries do not meet a desired level of performance during the test, those batteries are removed from the corresponding power system (for example, a UPS or other energy storage system) and replaced. In some examples, an SoH of a UPS battery is tested by executing a depletion test in which the battery powers a load until the battery is fully (or mostly) discharged. Understandably, this process can be inefficient and time-consuming. Moreover, once the battery is discharged, it must be re-charged before the associated UPS can provide battery power again. As a result, battery testing may be infrequently performed and batteries may be in operation even though they have dropped below a desired level of performance. Moreover, some techniques for determining when a battery should be depletion-tested rely primarily on battery age. Such techniques may ignore other effects on battery health and may therefore lead to premature or late battery replacement.

Accordingly, aspects and embodiments described herein provide battery health diagnostic and analytic systems and methods that reliably predict battery health status, and therefore, accurately detect battery misuse, battery defects, and geographical and/or environmental influences on performance. In particular, examples of the battery health diagnostic and analytic systems described herein may interface with one or more smart stationary batteries, and one or more networks of smart stationary batteries, to leverage the data logging and self-reporting features of smart stationary batteries. Smart stationary battery operating conditions and operating characteristics and SoH information may be received and analyzed for a variety of smart stationary battery networks, thereby enabling battery baseline characteristics that may be used to gauge the performance of related smart stationary batteries (for example, smart stationary batteries of the same model, versions, and/or manufacturing batch) to be determined.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

Referring to FIG. 1, generally illustrated is one example of a battery health diagnostic and analytics system 100 (also generally referred to herein as "battery health system" 100) coupled via one or more network connections with two smart stationary battery networks. In various examples, the battery health system 100 may be connected to more than two smart stationary battery networks. That is, FIG. 1 shows two smart stationary battery networks 102, 104 for the convenience of illustration, and in many examples the battery health system 100 may be connected and communicate with many smart stationary battery networks (and/or individual smart stationary batteries) located all over the United States, and in some instances, all over the world.

As shown, the battery health diagnostic and analytics system 100 may include one or more local servers each coupled to a corresponding battery health status database. In FIG. 1, a first local server 106 is shown coupled to a first battery health status database 108, and a second local server 110 is shown coupled to a second battery health status database 112. While illustrated separately, in other examples, each battery health status database 108, 112 may be incorporated as part of the corresponding local server.

The local servers 106, 110 are also coupled to each other via a network, networks, or interconnected networks (shown and described generally as "network" 114) and further coupled to one or more cloud computing servers 116 via the network 114. In various examples, and as further illustrated in FIG. 1, the battery health system 100 may include a cloud service comprised of cloud computing servers coupled via the network 114 with the one or more local servers 106, 110. For instance, FIG. 1 shows the cloud computing server 116 coupled with the first local server 106 and the second local server 110 via the network 114. The cloud computing server 116 may also be coupled to a corresponding battery health database 118, as also shown in FIG. 1.

FIG. 1 further illustrates each local server 106, 110 coupled to at least one network of smart stationary batteries. In particular, the first local server 106 is shown as coupled to a first smart stationary battery network 102, and the second local server 110 is coupled to a second smart stationary battery network 104. In particular, each local server 106, 110 may be coupled to one or more local networks of smart stationary batteries via a local network connection, and may also be coupled via the network 114 to one or more remote (for example, external) networks of smart stationary batteries. For instance, in FIG. 1 the first local server 106 is coupled to a local network of smart stationary batteries (for example, battery network 102) via the local network connection (shown generally as local network connection 124), and also coupled to a remote network of smart stationary batteries (for example, battery network 104) via the network 114 and the second local server 110. Similarly, from the perspective of the second local server 110, the second local server 110 is coupled to a local network of smart stationary batteries (for example, battery network 104) via a local network connection (shown generally as local network connection 126), and also coupled to a remote network of smart stationary batteries (for example, battery network 102) via the network 114 and the first local server 106. In various examples, the first local server 106 is geographically distinct from the second local server 110. That is, the first and second local servers 106, 110 may be in separate geographic locations.

In various examples, each local server 106, 110 may exchange (for example, transmit and receive) sensor data and information with the respective smart stationary battery network via the corresponding local network connection 124, 126. Similarly, each local server 106, 110 may exchange (for example, transmit and receive) data and information with the other local servers, the cloud service, and the respective remote smart stationary battery networks via the network 114. While not explicitly illustrated in FIG. 1, in certain examples, each smart stationary battery network 102, 104 may also directly communicate with the cloud computing server 116 to send and receive data and information, for instance, via the network 114.

In various examples, the local network connection(s) 124, 126 are each a private network, such as an industrial network. In such an example, the smart stationary battery networks 102, 104 may communicate with a control node using an industrial protocol, such as Modbus, which may communicate directly with the local servers 106, 110. However, in other examples the local networks connection(s) 124, 126 are each a public network, such as the Internet. Accordingly, in various examples, the local network connection(s) 124, 126 may each include or be part of a private internet protocol (IP) network, the Internet, an integrated services digital network (ISDN), a public or private data network, a local area network (LAN), a metropolitan area network (MAN), a wide area network (WAN), a wireline or wireless network, a cellular network, or any combination thereof, or any other suitable communication means, including but not limited to hardwired communication networks.

In various examples, each smart stationary battery network, such as the first and the second smart stationary battery networks 102, 104, may be composed of one or more individual smart stationary batteries 130. Smart stationary batteries 130 may be arranged individually within a network or may be arranged in groups, such as battery banks. In various examples, and as further described below, each smart stationary battery 130 may be a smart stationary UPS battery. In other examples, each smart stationary battery 130 may be a smart stationary battery within another advanced energy storage system. Particular examples of smart stationary batteries 130 may include lithium-ion (Li-ion) batteries and lead acid batteries. In FIG. 1, the first network 102 is shown as including a first group 132 of smart stationary batteries 130 arranged in a first battery bank, and a second group 134 of smart stationary batteries 130 arranged in a second battery bank. The second network 104 is shown as including another group 136 of smart stationary batteries 130 arranged in a third battery bank. Each smart stationary battery network 102, 104 may include multiple groups of smart stationary batteries. For instance, this may be the case in a data center or a grid power energy storage facility.

In various examples, each smart stationary battery 130 is an intelligent device capable of locally measuring and logging data during the operation thereof. Such data may be referred to herein as sensor data. As discussed herein, "stationary" may refer to a battery that is installed in a fixed location, for example, in contrast to other more mobile batteries, such as those found in electric vehicles. In other embodiments, however, at least one of the smart stationary batteries 130 may be replaced by one or more mobile batteries. That is, the principles of the disclosure are not limited to stationary batteries and may be applied to mobile batteries. In addition to smart stationary UPS batteries, other examples of smart stationary batteries 130 may include smart stationary batteries for electric grid energy storage or residential energy storage. In various examples, smart stationary batteries 130 have integrated battery management systems that allow for accurate hysteresis based on the date of manufacture of the smart stationary battery 130. Such features are in contrast to typical batteries, which may begin data logging after the battery is installed. That is, in various smart stationary batteries 130, data logging may be based on the moment of manufacture, instead of when a user installs and manually enters the install date.

Each smart stationary battery 130 may include one or more sensors and one or more processing components configured to monitor and/or record sensor data, such as operating conditions and/or operating characteristics of the corresponding smart stationary battery 130. In certain other examples, a group of smart stationary batteries 130 within a battery bank, such as the first group 132 of smart stationary batteries 130 shown in FIG. 1, may share the same one or more sensors and processing component. The one or more sensors may include a power meter, such as a current or voltage sensor, a temperature sensor, or other environmental sensors (for example, humidity, wind, and so forth). The one or more sensors may provide continuous or periodic sensor data based on measured values, which is stored by the processing component with information descriptive of the measurements and times that measurements were taken (for example, a time stamp).

The one or more sensors may record operating conditions and/or operating characteristics of the corresponding smart stationary battery 130 and provide that information to the processing component. In some implementations, the one or more sensors may be coupled to an analog-to-digital converter that provides the processing component with a digital signal representative of the measured operating characteristics and/or operating conditions. As discussed herein, the operating characteristics of a smart stationary battery 130 may include one or more characteristics of the operation of the smart stationary battery 130 during the operation of the smart stationary battery 130. For instance, operating characteristics may include, but are not limited to, one or more of, current, voltage, power, duty cycles, depth of discharge (DoD) (for example, for each cycle), rate of discharge, rate of charge, and/or the general time stamping of a smart stationary battery 130 during operation, to name a few examples. Operating conditions, as discussed herein, may include the one or more conditions of the smart stationary battery 130 (for example, temporal and/or environmental conditions) during the operation of the smart stationary battery 130. For instance, operating conditions may include battery temperature, cell temperature, duration of temperature or cell temperature, cycle timing during a temperature or cell temperature, date, and humidity, among other environmental factors. In some examples, the term "operating information" may include the operating conditions, the operating characteristics, or both collectively.

The processing component of each smart stationary battery 130 is configured to be coupled to the one or more sensors and may include any suitable processing component, such as a microcontroller, an application-specific integrated circuit (ASIC), and/or a field-programmable gate array (FPGA). While in some examples the processing component may be directly incorporated within a smart stationary battery 130, in other examples, the processing component may be located remotely from a smart stationary battery 130, such as within a control node. In such an example, the one or more sensors may communicate the sensor data to the control node. The processing component may have a network interface through which the processing component is configured to communicate with a local server, such as the first local server 106 or the second local server 110. In particular, the processing component of each smart stationary battery 130 (or smart stationary battery bank) may communicate the logged sensor data (for example, operating characteristics and operating conditions) to a corresponding local server 106, 110 over the local network connection (for example, local network connections 124, 126 shown in FIG. 1), or the cloud service over the network 114.

Figure 2:
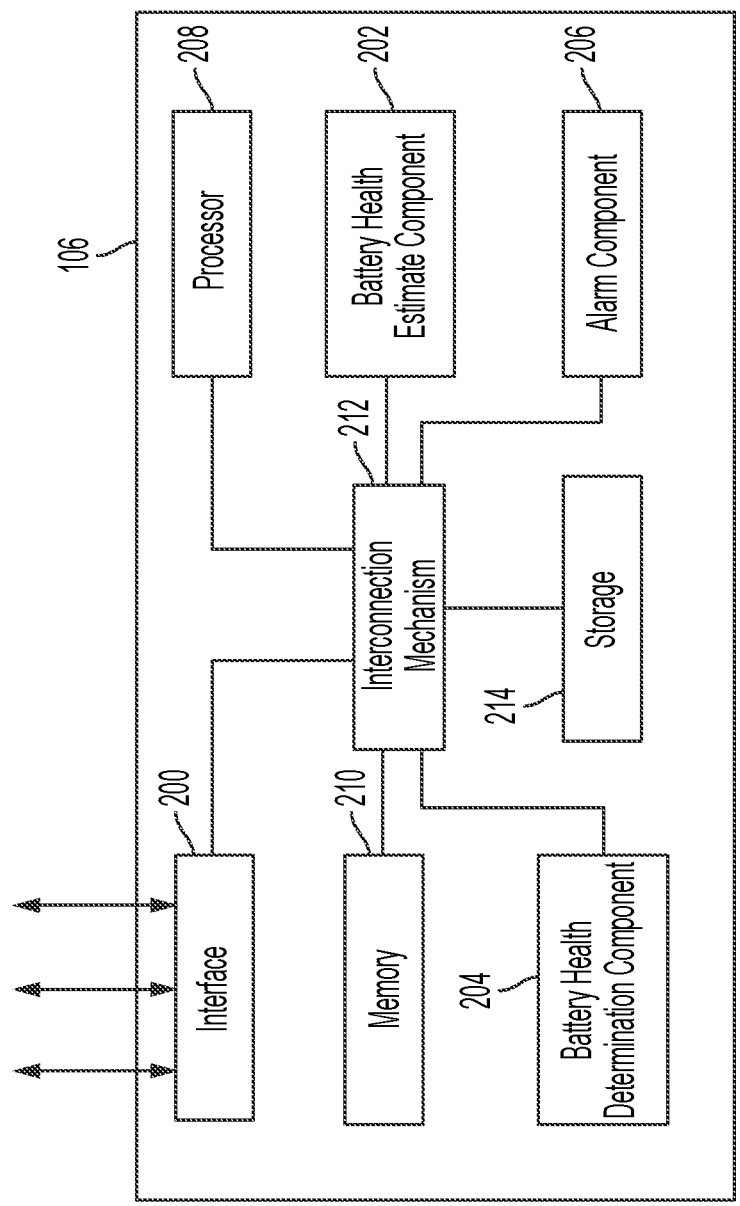
FIG. 2 is a more detailed block diagram of a local server illustrated in FIG. 1, according to various examples described herein.

In various examples, the battery health system 100 may include one or more electrical hardware components or one or more software components implemented within one or more of the local servers 106, 110. That is, in one example, the battery health system 100 may be implemented entirely within the first local server 106. However, in another example, the battery health system may be implemented across multiple servers, such as the first local server 106 and the second local server 110. In still other examples, the battery health system 100 may include one or more electrical hardware components or one or more software components implemented entirely within the cloud service, or implemented within both a local server (or local servers) and the cloud service. In each of the described examples, each of the electrical hardware components or software components may be implemented on one or more data processing systems, such as a computer system. For purposes of explanation, FIG. 2 illustrates one or more components of the health status system 100 within a block diagram of the first local server 106 illustrated in FIG. 1. It is appreciated that similar components may be implemented within the second local server 110 and/or the cloud computing server 116. FIG. 2 is described with continuing reference to FIG. 1.

In various examples, the health status system 100 may include, implemented within the first local server 106, an interface 200 to receive the sensor data (for example, operating conditions and the operating characteristics) of one or more smart stationary batteries 130, a battery health estimate component 202 configured to determine an estimated battery health status of the one or more smart stationary batteries 130 based on baseline characteristics for the one or more smart stationary batteries 130 (for example, stored in a storage 214, the database 108, or another storage) and operating information received at the interface 200, and a battery health determination component 204. The battery health determination component 204 may be configured to determine an actual battery health status of the one or more smart stationary batteries 130 based on information (for example, sensor data received at the interface 200) determined during an SoH check. The SoH check may include a depletion test that, as discussed above, may include discharging the one or more smart stationary batteries 130 to a load until the one or more smart stationary batteries 130 are mostly or fully discharged. Sensor data acquired during a partial discharge depletion test (that is, a discharge test in which the one or more smart stationary batteries 130 are not fully discharged) may in some examples be accompanied by confidence data indicative of a level of confidence that the partial discharge test accurately represents an SoH of the one or more smart batteries 130.

Sensor data and/or other information may be obtained during the SoH check (for example, charge capacity information, discharge time information, and so forth), and may be provided to the battery health determination component 204. In some examples, "actual health information" may include the sensor data and other information that is determined and/or generated during a SoH check, including but not limited to a depletion test and received at the interface 200. The battery health determination component 204 may determine an actual health of the one or more smart stationary batteries 130 for which actual health information is obtained based on the actual health information.

In some examples, the battery health determination component 204 may compare the estimated battery health status and the actual battery health status of the one or more smart stationary batteries 130, and adjust the baseline characteristics for the one or more smart stationary batteries 130 based at least in part on the comparison of the estimated battery health status and the actual battery health status. As also shown in FIG. 2, the health status system 100 may also include, implemented within the local server 106, an alarm component 206. The alarm component 206 may be configured to generate one or more notifications, alarms, or other outputs based on the comparison, such as one or more outputs associated with a remaining charge capacity of the one or more smart stationary batteries 130.

In some examples, the local server 106 may only determine, using the battery health estimation component 202, an estimated battery health status of the one or more smart stationary batteries 130, and may or may not determine an actual battery health status of the one or more smart stationary batteries 130 using the battery health determination component 204. Similarly, in some examples, the local server 106 may only determine, using the battery health determination component 204, an actual battery health status of the one or more smart stationary batteries 130, and may or may not determine an estimated battery health status of the one or more smart stationary batteries 130 using the battery health estimate component 202. In various examples, an actual battery health status and/or an estimated battery health status may be output to a user (for example, via a user interface connected locally or via a wired or wireless connection with the local server 106). Furthermore, in some examples, the local server 106 may determine only one or neither of the actual battery health status and the estimated battery health status, and the local server 106 may instead provide information (for example, operating information and/or actual health information) to one or more external entities (for example, the cloud computing server 116 and/or the local server 110) that enables the one or more external entities to determine the actual battery health status and/or the estimated battery health status based on the information. For example, the cloud computing server 116 may include similar or identical components as the components 202-214. The one or more external entities may transmit the determined actual battery health status and/or the estimated battery health status back to the local server 106, a user, or both.

In various examples, each of the battery health estimate component 202, battery health determination component 204, and alarm component 206 may be a software component that encapsulates a set of related routines and/or data. As will be understood to one of ordinary skill in the art, the routines and/or data within each software component are semantically related. In some examples, the battery health estimate component 202, battery health determination component 204, and alarm component 206 may take the form of objects, or collections of objects, in a textual or binary form. Each of the battery health determination component 204, battery health estimate component 202, and alarm component 206 may be coupled to and executed by a processor 208. Particular examples of the operations performed by each of the battery health estimate component 202, battery health determination component 204, and alarm component 206 are further described below with reference to FIGS. 4-6B.

In various examples, the local server 106 may also include a memory 210, an interconnection element 212, and a storage element 214. To implement at least some of the aspects, functions, and processes disclosed herein, the processor 208 executes a series of routines that result in manipulated data. The processor 208 may be any type of processor, multiprocessor or controller. Example processors may include an Intel Xeon, Itanium, or Core processor; an AMD Opteron, Threadripper, or Epyc processor; an Apple A4 or A5 processor; an IBM Power5+ processor; an IBM mainframe chip; or a quantum computer. The processor 208 is connected to other system components, including one or more memory devices 210, the battery health estimate component 202, the battery health determination component 204, the alarm component 206, and the storage 214 via the interconnection element 212.

The memory 210 stores programs (for example, sequences of instructions coded to be executable by the processor 208) and data during operation of the local server 106. Thus, the memory 210 may be a relatively high-performance, volatile, random-access memory ("RAM") such as a dynamic random-access memory or static random-access memory. However, the memory 210 may include any device for storing data, such as a disk drive or other nonvolatile storage device. Various examples may organize the memory 210 into particularized and, in some cases, unique structures to perform the functions disclosed herein. These data structures may be sized and organized to store values for particular data and types of data.

Components of the local server 106 are coupled by an interconnection element such as the interconnection element 212. The interconnection element 212 may include any communication coupling between system components such as one or more physical busses in conformance with specialized or standard computing bus technologies such as IDE, SCSI, PCI and InfiniBand. The interconnection element 212 enables communications, including instructions and data, to be exchanged between system components of the local server 106.

The local server 106 also includes one or more interface devices 200 such as input devices, output devices, and/or combination input/output devices. Interface devices 200 may receive inputs or provide outputs. More particularly, output devices may render information for external presentation. Input devices may accept information from external sources. In some particular examples, the interface 200 is a sensor interface to receive the sensor data, and/or a communication interface to provide the sensor data and/or one or more notifications, alarms, or other outputs. Interface devices allow the local server 106 to exchange information and to communicate with external entities, such as users and other systems (for example, the cloud service and the local server 110).

The data storage element 214 includes a computer-readable and -writeable nonvolatile, or non-transitory, data storage medium in which instructions are stored that define a program or other object that is executed by the processor 208. The data storage element 214 also may include information that is recorded on or in the medium, and that is processed by the processor 208 during execution of the program. More specifically, the information may be stored in one or more data structures specifically configured to conserve storage space or increase data exchange performance.

The instructions may be persistently stored as encoded signals, and the instructions may cause the processor 208 to perform any of the functions described herein. The medium may, for example, be an optical disk, magnetic disk, or flash memory, among others. In operation, the processor 208, or some other controller, causes data to be read from the nonvolatile recording medium into another memory, such as the memory 210, that allows for faster access to the information by the processor 208 than does the storage medium included in the data storage element 214. The memory may be located in the data storage element 214 or in the memory 210. The processor 208 may manipulate the data within the memory 210, and may copy the data to the storage medium associated with the data storage element after processing is completed. A variety of components may manage data movement between the storage medium and other memory elements and examples are not limited to particular data management components. Further, examples are not limited to a particular memory system or data storage system.

Although the local server 106 is shown by way of example as one type of local server upon which various aspects and functions may be practiced, aspects and functions are not limited to being implemented on the local server 106. Various aspects and functions may be practiced on one or more computers having different architectures or components than those shown in FIG. 2. For instance, the local server 106 may include specially programmed, special-purpose hardware, such as an ASIC tailored to perform a particular operation disclosed herein. Another example may perform the same operation using a grid of several specialized computing devices running proprietary hardware and/or operating systems.

The local server 106 may be a local server including an operating system that manages at least a portion of the hardware elements included in the local server. In some examples, a processor or controller, such as the processor 208, executes an operating system. Examples of a particular operating system that may be executed include a Windows-based operating system, such as Windows Phone or Windows 10 operating systems available from the Microsoft Corporation, Android operating system available from Google, Blackberry operating systems available from Blackberry Limited, a MAC OS System X operating system or an iOS operating system available from Apple, one of many Linux-based operating system distributions, for example, the Enterprise Linux operating system available from Red Hat Inc., or UNIX operating systems available from various sources. Many other operating systems may be used, and examples are not limited to any particular operating system.

The processor 208 and operating system(s) together define a computer platform for which application programs in high-level programming languages are written. These component applications may be executable, intermediate, bytecode, or interpreted code which communicates over a communication network, for example, the Internet, using a communication protocol, for example, TCP/IP. Similarly, aspects may be implemented using an object-oriented programming language, such as .Net, Ruby, Objective-C, Java, C++, Ada, C# (C-Sharp), Python, or JavaScript. Other object-oriented programming languages may also be used. Alternatively, functional, scripting, or logical programming languages may be used.

Additionally, various aspects and functions may be implemented in a non-programmed environment. For example, documents created in HTML, XML, or other formats, when viewed in a window of a browser program, can render aspects of a graphical-user interface or perform other functions. Further, various examples may be implemented as programmed or non-programmed elements, or any combination thereof. For example, a web page may be implemented using HTML while a data object called from within the web page may be written in C++. Thus, the examples are not limited to a specific programming language and any suitable programming language could be used. Accordingly, the functional components disclosed herein may include a wide variety of elements (for example, specialized hardware, executable code, data structures or objects) that are configured to perform the functions described herein.

In some examples, the components disclosed herein may read parameters that affect the functions performed by the components. These parameters may be physically stored in any form of suitable memory including volatile memory (such as RAM) or nonvolatile memory (such as a magnetic hard drive). In addition, the parameters may be logically stored in a propriety data structure (such as a database or file defined by a user mode application) or in a commonly shared data structure (such as an application registry that is defined by an operating system). In addition, some examples provide for both system and user interfaces that allow external entities to modify the parameters and thereby configure the behavior of the components.

Figure 3:
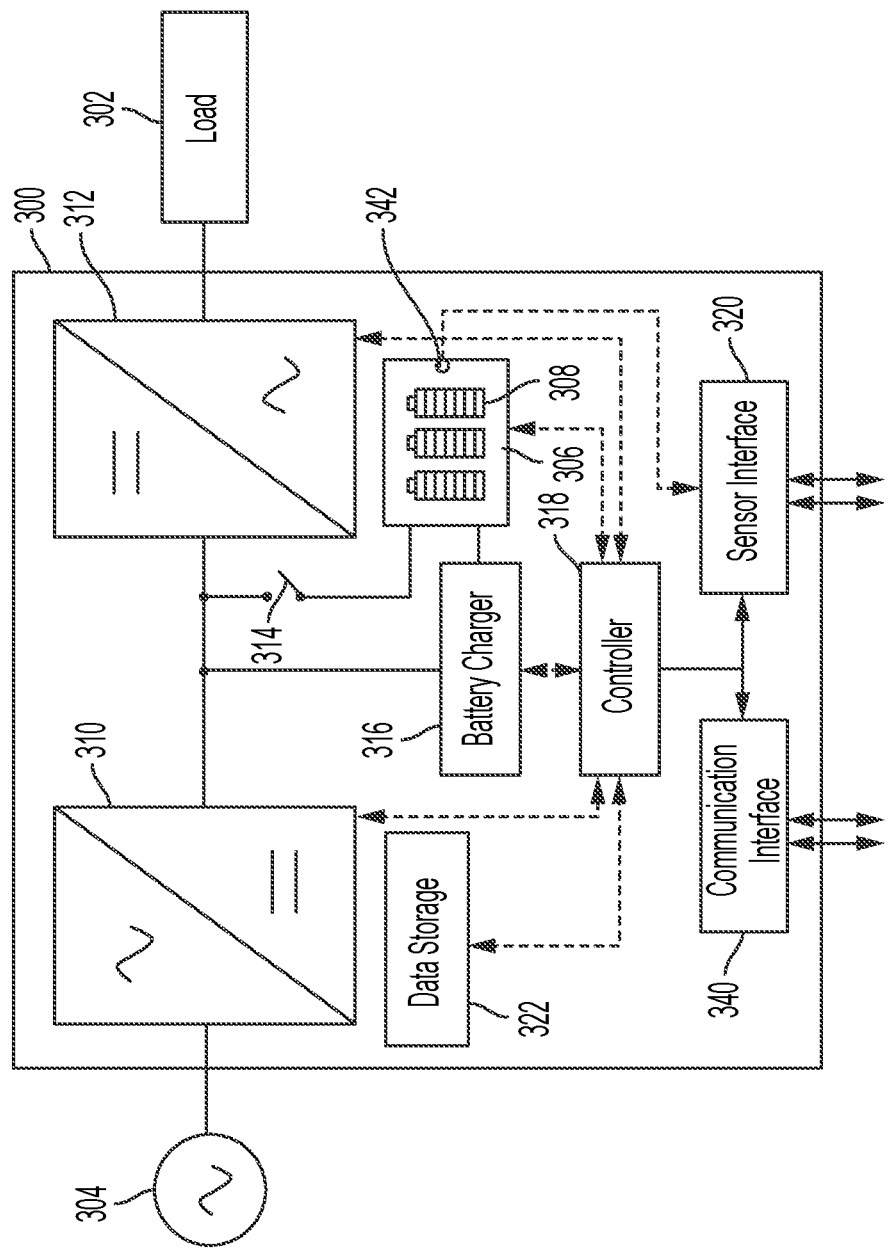
FIG. 3 is an uninterruptible power supply according to various examples described herein.

While in some examples, routines and data of the battery health determination component 204, battery health estimate component 202, and alarm component 206 may be implemented at the local server 106, as shown in FIG. 2, in certain other examples, such routines and data may be implemented by a processing component, such as a controller, of a UPS. One such example is shown in FIG. 3. While FIG. 3 illustrates one particular example, embodiments of the UPS discussed herein may be an online, offline, or line-interactive UPS.

Referring to FIG. 3, there is illustrated a block diagram of one example of a UPS 300 according to various aspects and embodiments. The UPS 300 provides regulated power to a load 302 from either an AC power source 304 (for example, AC mains) or a back-up power source 306, such as a battery. In various examples, the battery may include one or more smart stationary batteries 308, such as the smart stationary batteries 130 discussed above with reference to at least FIG. 1. While shown in FIG. 3 as including a group of three smart stationary batteries 308, in various embodiments the UPS 300 may include a single smart stationary battery 308, or an array of any number of smart stationary batteries 308, for back-up power. The UPS 300 includes an AC-DC converter 310, a DC-AC converter 312, a relay 314, a battery charger 316, one or more interface devices 320, 340, and a controller 318 for controlling the AC-DC converter 310, the DC-AC converter 312, the relay 314, the back-up power source 306, the battery charger 316, and the one or more interface devices 320, 340. The controller 318 may also implement the one or more routines and/or data of the battery health determination component 204, battery health estimate component 202, and alarm component 206 shown in FIG. 2. In various examples, the UPS 300 may exchange information, such as sensor data (for example, operating information and actual health information), with one or more external entities (for example, the local server 106 and/or cloud computing server 116) via the interface devices 320, 340. FIG. 3 illustrates the UPS 300 as including a sensor interface 320 and a communication interface 340. The sensor interface 320 may receive the sensor data from a sensor 342 coupled to the one or more smart stationary batteries 130, and the communication interface 320 may communicate with one or more external entities (for example, a local server and/or a cloud service). Such information may also be stored at the UPS 300 at a data storage 322. The UPS 300 has an input coupled to the AC power source 304 and an output coupled to the load 302.

During a line mode of operation, and under control of the controller 318, the AC-DC converter 310 converts the input AC voltage into a DC voltage at the DC bus. For example, the DC bus may be rated up +/−500 VDC. In a back-up mode of operation (optionally called battery mode of operation), upon loss of input AC power, the relay 314 is activated and the UPS 300 generates a DC voltage from the smart stationary battery 308. The length of time for which the smart stationary battery 308 can supply the DC voltage is referred to as the "runtime" of the smart stationary battery 308. The battery charger 316 is used to recharge the smart stationary battery 308 and may be controlled by the controller 318. In various embodiments the back-up power source 306 may be charged during line mode of operation. In line mode, the DC-AC converter 312 converter receives the DC voltage from the AC-DC converter 310, whereas, during back-up mode of operation the DC-AC converter 312 converter receives a DC voltage from the back-up power source 306. The DC-AC converter 310 converts the DC voltage into an output AC voltage and delivers the AC output to the load 302. In various embodiments, the relay 314 is controlled by the controller 318, for example, to alternate between a line mode and a back-up mode of operation.

Returning to FIG. 1, in various examples the battery health system 100 further includes the cloud computing server 116. As previously discussed, various aspects and functions described herein may be implemented as specialized hardware or software components executing as a cloud service. The cloud computing server 116 may consist of memory and one or more processors configured to analyze information and store information in databases. In particular, the routines and/or data of one or more of the battery health determination component 204, battery health estimate component 202, and alarm component 206 may be provisioned as one or more cloud instances between the various computing devices (for example, cloud computing servers 116) of the cloud service.

In various examples described herein, "cloud server" or "cloud computing server" refers to any appropriate Internet-based application server or computer resource, and may include any storage sub-system or collection of storage subsystems that are accessible over the Internet or public network for storing data. For example, the cloud computing server 116 can provide a service in which data is maintained and managed remotely and made available via the network 114. Cloud storage can include private or public cloud systems distributed over multiple geographically dispersed locations. Cloud storage allows for large data sets to be handled without any storage infrastructure constraints, and can be accessed from multiple locations.

The cloud service may also include a distributed file system, shown generally in FIG. 1 as the battery health database 118. The distributed file system may include a Hadoop cluster, which functions to manage data stored at the cloud service. In general, Hadoop is a software framework for storing and processing large amounts of data in a distributed fashion across large clusters of storage entities. As will be appreciated, Hadoop is just one example of a type of distributed computing application that may be used in the cloud service and other types are within the scope of this disclosure. Other types of cloud storage, including databases and database technologies may also be included in the cloud service, such as a structured query language (SQL) database. Data stored at the cloud computing server 116 can be automatically queried or otherwise accessed at predetermined time intervals, and in some instances, may be updated at predetermined time intervals. For instance, one or more of the databases stored at the cloud computing server 116 may be queried or otherwise accessed.

Similar to the local server 106 described with reference to FIG. 2, in various examples the cloud computing server 116 may include an interface to receive the sensor data (for example, operating information and/or actual health information) of a smart stationary battery 130. The cloud computing server 116 may execute a cloud instance, which may include a provision of the routines and/or data of one or more of the battery health estimate component 202, battery health determination component 204, and/or alarm component 206.

In various examples, the cloud service may be implemented on a distributed computer system using one or more communication networks (for example, the Internet). For example, the cloud service may include a webserver that is capable of serving as a front end to the service. In one implementation, the service is implemented in a cloud-based computing platform, such as the well-known EC2 platform available commercially from Amazon.com, Seattle, Wash. Other implementations are possible and are within the scope and spirit of the invention, and it is appreciated that other platforms may be used. For instance, in one example the cloud service is the Schneider Electric Cloud Virtual Service of Schneider Electric, Rueil-Malmaison, France.

Figure 4:
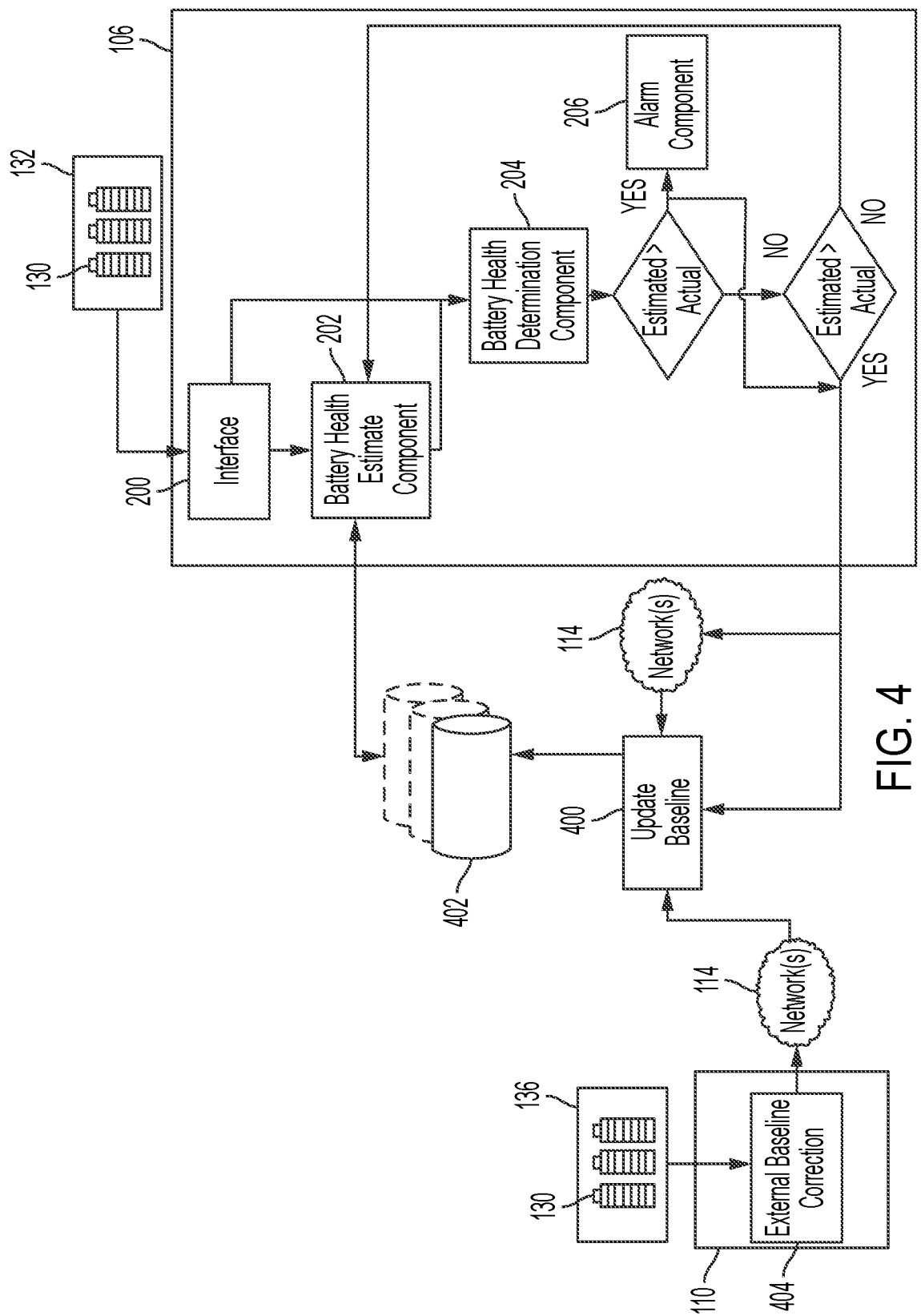
FIG. 4 is a block diagram of the intercommunications between components of the battery health system illustrated in FIG. 1, according to various examples described herein.

FIG. 4 illustrates a block diagram of an exemplary intercommunication of the components of the battery health system 100 and the one or more smart stationary batteries 130 described with reference to FIGS. 1 and 2. As such, FIG. 4 is described with continuing reference the battery health system 100 and smart stationary battery networks 102, 104 illustrated in FIG. 1, as well as the particular implementation of the first local server 106 illustrated in FIG. 2.

In many instances, smart stationary batteries 130 are packaged with manufacturer-supplied information that details the usage and environmental parameters that may impact the life of the associated smart stationary battery. This manufacturer-supplied information may be directly impacted by the actual environmental conditions and operating characteristics of the associated smart stationary battery 130. Accordingly, various examples of the battery health system 100 described herein utilize the manufacturer-supplied information, along with the logged sensor data from the smart stationary batteries 130, to provide analytics and diagnostics for system manufacturers, owners, and maintainers to understand the status and health of the smart stationary batteries 130. In particular, examples of the battery health system 100 may monitor, analyze, diagnose, learn, predict, and inform of the health, reliability, and remaining life of one or more deployed smart stationary batteries 130. Specifically, the battery health system 100 may continue to refine analytics regarding the battery health status of one or more smart stationary batteries 130 through statistical analysis (for example, regression, interpolation, and so forth) as new information is made available from deployed smart stationary batteries 130, and actual performance is validated. Importantly, such analysis, diagnosis, and other operations may be performed in real-time as measured operating information and/or actual health information are made available. Moreover, the battery health system 100 may continuously adjust one or more predictive models.

Referring to FIG. 4, in various examples, the battery health estimation component 202 may determine an estimated battery health status of at least a first smart stationary battery 130 based on baseline characteristics for that smart stationary battery 130 and based on operating information received from the smart stationary battery 130 via the interface 200. In particular, the baseline characteristics for the smart stationary battery 130 may initially be derived from manufacturer specifications for the smart stationary battery 130. Over time, the baseline characteristics may be adjusted based on information (for example, operating information and actual health information) provided to the battery health determination component 204. For example, the baseline characteristics may be adjusted where an estimated battery health status for one or more of the smart stationary batteries 130, generated based on the baseline characteristics, deviates from an actual battery health status of the one or more smart stationary batteries 130. The baseline characteristics may not be unique to any particular smart stationary battery 130, but may instead be the same for each smart stationary battery 130 having the same particular model or type. For instance, the baseline characteristics may be based on a particular model, a particular version, or even a particular manufacturing batch of smart stationary batteries 130.

The baseline characteristics may be determined by the local server 106 and/or received from an external entity or entities, such as the cloud computing server 116. In some examples, the local server 106 may be configured to determine both the estimated battery health status and the actual battery health status, and may locally store baseline characteristics (for example, in the storage 214 and/or the database 108). In other examples, the local server 106 may determine one or more of the operating information and the actual health information, and may transmit the operating information and/or the actual health information to another entity, such as the cloud computing server 116. The local server 106 may store baseline characteristics and may transmit the actual battery health status and/or the estimated battery health status to the local server 106.

In particular examples, the manufacturer specifications upon which the baseline characteristics may initially be based may include an initial capacity, a calendar life at room temperature, a calendar life at an elevated temperature, a shelf life at room temperature, and a discharge cycle count to an end-of-life (EoL) (for example, at room temperature), to name a few examples. These manufacturer specifications may set the initial baseline characteristics for the smart stationary battery 130. As described in further detail below, in some instances the baseline characteristics may be updated or adjusted (for example, in real-time) as information is gathered from the first smart stationary battery 130 and/or other related smart stationary batteries 130 (for example, other smart stationary batteries 130 of the same or a similar model). Accordingly, real-time baseline characteristics adjustments or updates for the first smart stationary battery 130 can keep the user apprised of the health and performance expectations for that smart stationary battery 130. More particularly, real-time baseline characteristics or updates may continuously refine the baseline characteristics based upon which the battery health estimate component 202 generate an estimated battery health status.

As shown in FIG. 4, in various examples the local server 106 may receive, via the local network connection 124, operating information and/or the actual health information (for example, sensor data) for the first smart stationary battery 130. In many instances the received sensor data includes data logged by the first smart stationary battery 130, such as time at temperature while at a full state-of-charge (SoC), cycle properties (for example, depth of discharge, temperature, rate, and time stamp), and storage characteristics (for example, inventory at half-SoC). The information may be received at the interface 200. Based on received operating information and baseline characteristics for the first smart stationary battery 130, the battery health estimate component 202 may determine an estimated battery health status of the first smart stationary battery 130 for the particular received operating information. That is, in various examples, the battery health estimate component 202 is configured to use the operating information as an input to the baseline characteristics to determine what the battery health status of the first smart stationary battery 130 should be. For instance, in one example the battery health estimate may include a remaining life for the first smart stationary battery 130 (for example, remaining charge or discharge capacity) that is expected given the operating information indicated by the sensor data.

In such an example, the estimated battery health status may be determined based on an initial remaining life percentage (for example, derived from the baseline characteristics) reduced by a remaining life percentage loss. The remaining life percentage loss may be determined based on baseline characteristics which, as discussed above, may be determined based on a combination of manufacturer-supplied information and actual health information that may be collected over time. Manufacturer-supplied information includes an estimated life percentage loss due to a time duration spent at a manufacturer-specified excessive temperature, an estimated life percentage loss due to a time duration spent at room temperature, and an estimated life percentage loss due to the number of discharge cycles, which may be used to determine an estimated remaining life percentage loss.

Continuing with the described example, the actual battery health status may include the actual life remaining of the first smart stationary battery 130 (for example, an actual remaining charge capacity percentage) determined at least partially based on actual health information received as a result of a SoH check, such as a depletion test, of the first smart stationary battery 130. In examples in which the local server 106 determines both the actual battery health status and the estimated battery health status, the battery health determination component 204 may be further configured to compare the estimated battery health status and the actual battery health status. In other examples, the battery health determination component 204 may determine an actual battery health status but may not compare the actual battery health status to an estimated battery health status, whether or not the battery health estimation component 202 determines an estimated battery health status.

As illustrated in FIG. 4, in comparing the estimated battery health status and the actual battery health status the battery health determination component 204 may determine if the estimated battery health status exceeds the actual battery health status. If the estimated battery health status does not exceed the actual battery health status, the battery health determination component 204 may determine if the actual battery health status exceeds the estimated battery health status.

If the battery health determination component 204 determines that the estimated battery health status exceeds the actual battery health status, the alarm component may generate one or more alarms, notifications, or other outputs. For instance, the alarm component 206 may generate one or more user alerts to be displayed on, or otherwise provided to, a user interface of a client computing system, such as computer, a tablet computer, a mobile phone, or a smart phone, to name a few examples. Such alerts may take the form of a pop-up window, a flag, an email notification, or other representation in connection with a user interface such as a battery management software program or dashboard. In certain other examples, the alarm component 206 may be configured to push one or more alerts through the network 114 to a mobile device, for instance, via a text message (for example, via a short message service). In particular examples, visual alerts may be accompanied or replaced by an auditory notification and/or a haptic (for example, vibration) notification. In the example described above, the alarm component 206 may generate and provide an output, such as an alarm, if the estimated remaining charge capacity exceeds the actual remaining charge capacity. Such an output may communicate that the smart stationary battery 130 is performing worse than the manufacturer expectations, which may indicate a defective battery. Similarly, in some examples, an alarm, notification, or other output may be generated if the actual battery health status exceeds the estimated battery health status.

Figure 5:
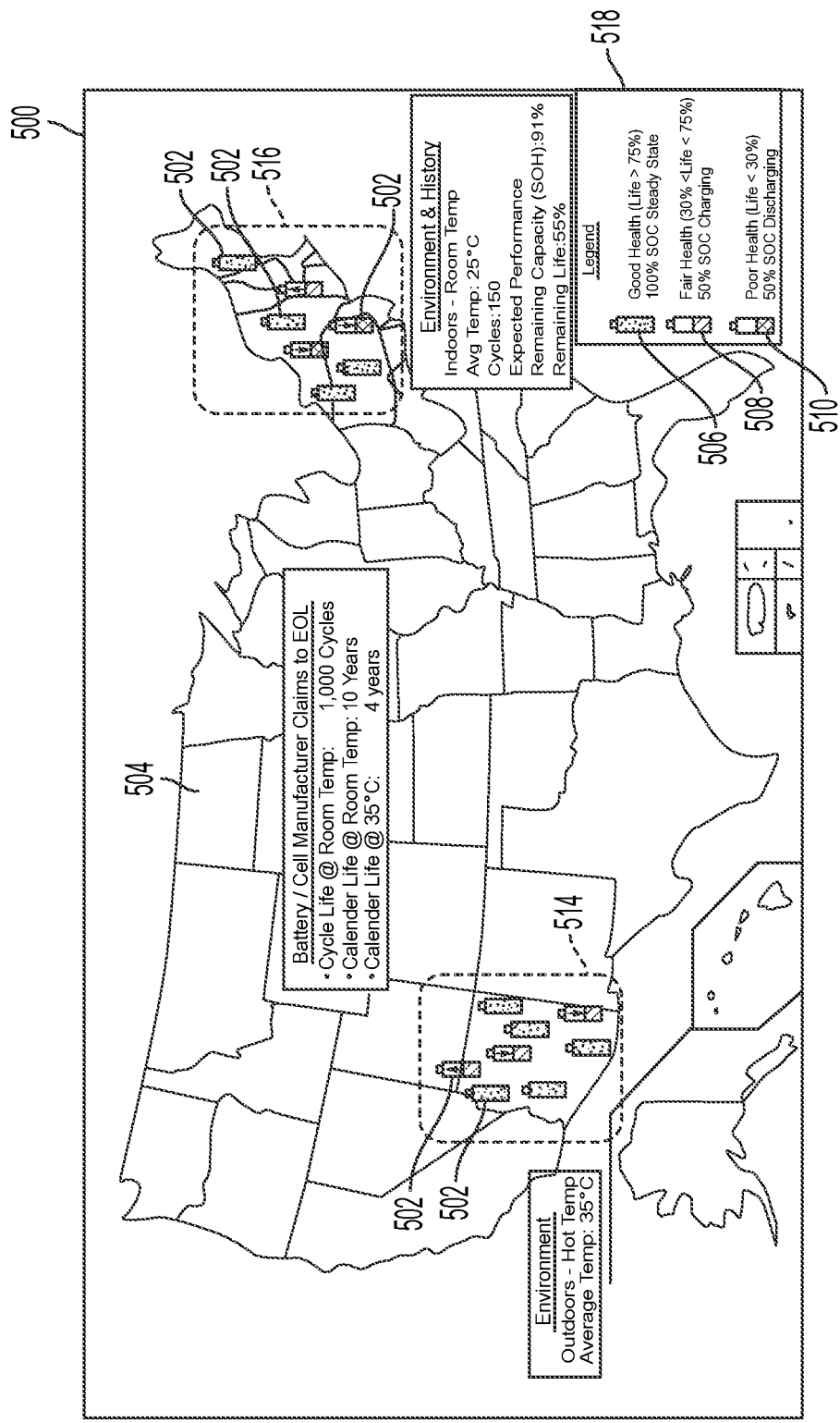
FIG. 5 is an illustration of a visual notification, according to various examples described herein.

In a particular example, the alarm component 206 (or another component of the battery health system 100) may generate a visualization of the battery health status of one or more smart stationary batteries 130 relative to the manufacturer specifications or claims. For instance, FIG. 5 illustrates one example of such a user interface visualization. Referring to FIG. 5, shown is a visualization 500 of the performance of various smart stationary batteries 130 which may include the first smart stationary battery 130, relative to each of the batteries' respective physical location within the United States. Each smart stationary battery is indicated by a battery icon 502 that is positioned on a map 504 of the United States at about the corresponding physical location of that smart stationary battery within the United States. While described with respect to individual smart stationary batteries, it is appreciated that similar examples may be implemented for groups of smart stationary batteries and/or networks of smart stationary batteries.

Each battery icon 502 has one or more attributes (for example, a pattern, color, shape, and so forth) that conveys the respective smart stationary battery's health status relative to a manufacturer's claimed health estimate. In particular, the smart stationary batteries that have an estimated battery health status equal to, or about equal to, a manufacturer-supplied battery health status estimate are indicated by a battery icon 502 that has a first attribute 508 (for example, a first color), the smart stationary batteries that have a battery health status below the anticipated health status are indicated by a battery icon 502 that has a second attribute 510 (for example, a second color) different than the first attribute 508, and the smart stationary batteries that have a battery health status that exceeds the anticipated health status are indicated by a battery icon 502 that has a third attribute 506 (for example, a third color) that is different from both the first and second attributes 508, 510. While described with reference to color, other visual attributes such as patterns, shapes, and so forth may be used within the visualization 500.

In FIG. 5, each battery icon 502 is also shown as having a further attribute indicative of the current operating state of the respective smart stationary battery, for example, steady state, charging, or discharging. In FIG. 5, a full patterned battery icon is indicative of a smart stationary battery that is at a steady SoC, a half-patterned battery icon with an upward-facing arrow is indicative of a smart stationary battery that is charging, and a half-patterned battery icon with a downward-facing arrow is indicative of a smart stationary battery that is discharging.

In some examples, and as further shown within the example visualization 500 of FIG. 5, additional information may be provided within the visualization 500. This information may include some or all of the baseline characteristics, the actual battery health status, the measured operating conditions, and the operating characteristics of the represented smart stationary batteries. In the particular illustrated example, each smart stationary battery is shown as grouped by a shared environment (for example, having a similar ambient temperature or a geographical region having a similar frequency of blackouts and/or brownouts). In particular, two environment groups 514, 516 are illustrated. Operating conditions for those shared environments, and example operating characteristics of one of the smart stationary batteries within those shared environments, are overlaid on the map 504. FIG. 5 further illustrates a visual representation of the manufacturer specifications upon which the baseline characteristics may be based, and a legend 518 providing a description of each battery icon 502. It is appreciated that FIG. 5 shows one possible visualization 500 and in other examples, other arrangements are possible and within the scope of this disclosure.

Returning to FIG. 4, if the battery health determination component 204 determines that the actual battery health status exceeds the estimated battery health status, or the battery health determination component 204 determines that the estimated battery health status exceeds the actual battery health status, the battery health determination component 204 may adjust the baseline characteristics for the first smart stationary battery 130 based at least in part on the comparison. One or more updates to baseline characteristics are represented generally as box 400 in FIG. 4.

In various examples, updates to baseline characteristics may be executed where an actual battery health status deviates from an estimated battery health status generated in accordance with the baseline characteristics which, as discussed above, may initially be based on manufacturer specifications. For example, in some instances this may include adjusting or modifying the baseline characteristics such that the adjusted or modified baseline characteristics produce a higher estimated battery health status based on the same input operating information. This may be the case when the actual battery health status (or multiple determinations of the actual battery health status) exceeds (for example, overperforms) an estimated battery health status generated by the baseline characteristics prior to such an adjustment or modification. In certain other examples, the baseline characteristics may be adjusted by adjusting or modifying baseline characteristics to produce a lower estimated battery health status based on the same input operating information. For instance, this may be the case when the actual battery health status (or multiple determinations of the actual battery health status) falls below (for example, underperforms) the estimated battery health status. It is appreciated that the estimated battery health status is based at least in part on the baseline characteristics. Therefore, the adjustments to the baseline characteristics may affect a subsequent determination of estimated battery health status.

As discussed with reference to at least FIG. 1, in various examples the first local server 106, second local server 110, and cloud computing server 116 may each have a corresponding battery health status database 108, 112, 118. Each local server 106, 110 and/or cloud computing server 116 may read and/or write data, such as baseline characteristics and/or baseline characteristic updates or adjustments to the corresponding battery health status database 108, 112, 118. In various examples, each local server 106, 110 and/or cloud computing server 116 may also read and/or write received operating conditions and operating characteristics to the corresponding database 108, 112, 118. Each of the local servers 106, 110 and cloud computing server 116 may have a database management system that interacts with the corresponding, the battery health status database 108, 112, 118, and other components to capture and transfer data. To name a few examples, database management systems may query, update, define, create, and otherwise administer the associated battery health status database 108, 112, 118. Each battery health status database 108, 112, 118 may be implemented within one or more data stores. Data stores, as described herein, may include any suitable repository for persistently storing collections of data.

Accordingly, in various examples the battery health determination component 204 may provide one or more baseline characteristic adjustments, or an instruction to update one or more baseline characteristics, to the corresponding local server battery health status database or the cloud computing server 116. If provided to the cloud computing server 116 (for example, via the network 114), the cloud computing server 116 may provide the adjustment or update to the corresponding battery health status database 118 and/or the local servers 106, 110 and/or the battery health status database 108, 112. In FIG. 4, the battery health status databases 108, 112, 118 of the local servers 106, 110 and cloud computing server 116 are collectively illustrated by databases 402.

As previously discussed with reference to FIG. 1, in various examples, the battery health system 100 leverages smart stationary battery logged sensor data received from local smart stationary battery networks, as well as remote smart stationary battery networks. That is, in various examples, the battery health system 100 may pool information from most or all operating smart stationary batteries 130 having the same or a similar model, and/or the same or a similar version, and/or being from the same manufacturing batch. Accordingly, the battery health status for more-recently deployed smart stationary batteries may be predicted based on the determined and previously adjusted baseline characteristics derived from older smart stationary batteries.

Accordingly, FIG. 4 illustrates baseline characteristics adjustments for a remote smart stationary battery network being performed at another local server. For instance, the baseline characteristics adjustments (represented generally by box 404) may be executed by the second local server 110 illustrated in FIG. 1. In various examples, the baseline characteristics correction is performed by similar components in a manner similar to that described above with reference to first local server 106. For instance, the second local server 110 may also include a battery health estimate component, a battery health determination component, and an alarm component. Operation and control of these components is not repeated here as it has been previously described.

In various examples, the smart stationary batteries 130 within the second smart stationary battery network 104 share the same baseline characteristics as the smart stationary batteries within first smart stationary battery network 102. That is, the baseline characteristics of a first smart stationary battery 130 in the first smart stationary battery network 102 may be the same as the baseline characteristics of a second smart stationary battery 130 in the second smart stationary battery network 104. Accordingly, adjustments to the baseline characteristics based on the actual performance of the first smart stationary battery may update the baseline characteristics of the second smart stationary battery 130, and therefore, affect the estimated health status of the second smart stationary battery 130. Likewise, adjustments to the baseline characteristics based on the actual performance of the second smart stationary battery 130 may update the baseline characteristics of the first smart stationary battery 130, and therefore, affect the estimated health status of the first smart stationary battery 130.

Accordingly, as shown in FIG. 4, one or more baseline characteristic updates, or an instruction to update one or more baseline characteristics, may be provided from the second local server 110 to the corresponding local server battery health status database 112 or the cloud computing server 116. If provided to the cloud computing server 116, the cloud computing server 116 may provide the update to the corresponding battery health status database 118 and/or the databases 108, 112. In particular examples, the update may be written to the receiving battery health status database 118 (for example, by a database management system).

In various examples, storing, managing, and adjusting baseline characteristics for one or more smart stationary batteries 130 at the cloud computing server 116 offers the advantages of improved accessibility, improved overhead, and improved efficiency. For instance, in at least one example the cloud computing server 116 may receive the operating characteristics and operating conditions of all (or most) smart stationary batteries 130 having the same model, version, and/or manufacturing batch. For instance, this information may be provided by each respective local server 106, 110. The cloud computing server 116 may also receive actual battery health status information provided by each respective local server 106, 110. In other embodiments, the cloud computing server 116 may receive actual health information from the local servers 106, 110 and may determine, based on the actual health information, a respective actual battery health status for each of the local servers 106, 110. Based on this information, the cloud computing server 116 may dynamically and in real-time adjust the baseline characteristics for these smart stationary batteries 130. The adjusted baseline characteristics for the smart stationary batteries 130 may then be pushed as updates to each local server 106, 110.

In one illustrative example, the first smart stationary battery 130 of the first smart stationary battery network 102 may exhibit better-than-predicted remaining life when compared to the battery manufacturer's original claims. Accordingly, the cloud computing server 116 may adjust the baseline characteristics for the first smart stationary battery 130 such that all other currently deployed smart stationary batteries 130 of the same model have an increased anticipated remaining life. As discussed herein, a model may refer to an identifier of a particular type of a manufactured product.

Figure 6A:
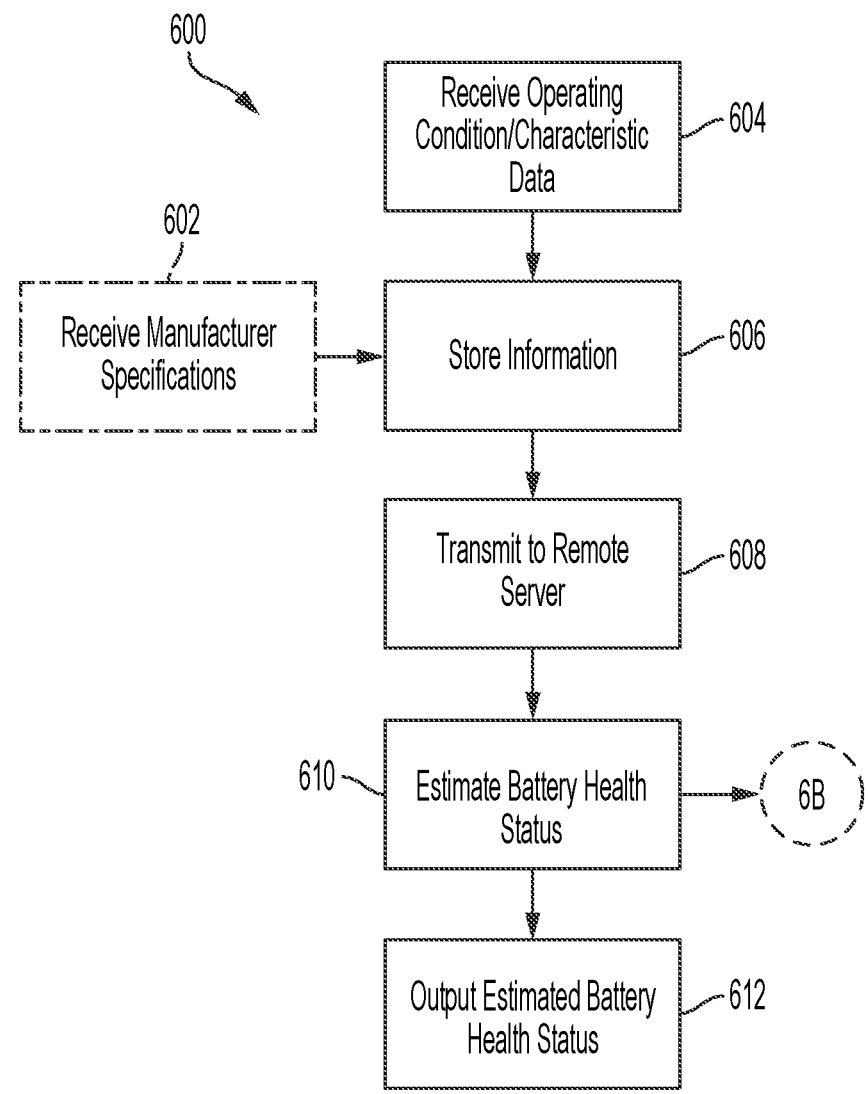
FIG. 6A is a process flow for providing battery health status information, according to various examples described herein.
Figure 6B:
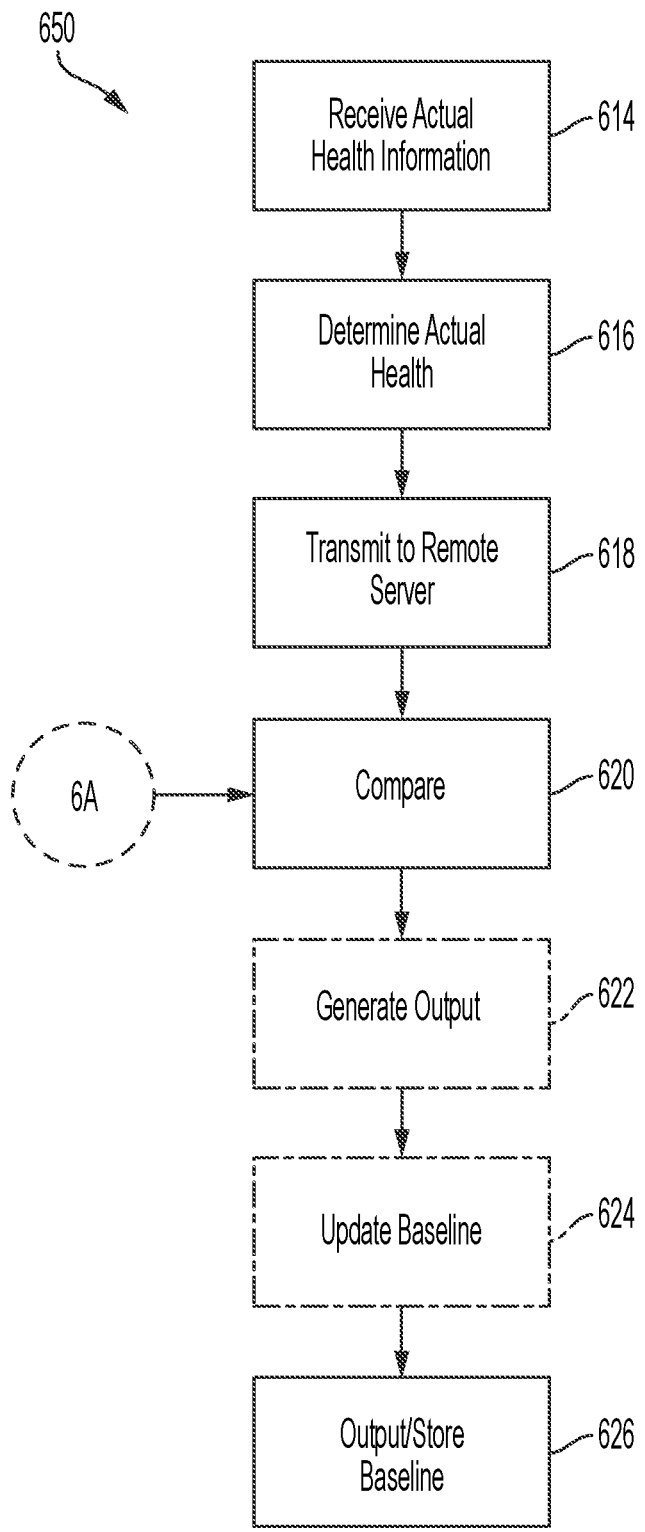
FIG. 6B is a process flow for updating baseline characteristics according to various examples described herein.

As discussed above with reference to at least FIGS. 1-5, various examples perform processes to communicate with one or more smart stationary batteries 130 to monitor operating information and/or actual health information, determine an actual battery health status and/or estimated battery health status of the one or more smart stationary batteries 130, and/or adjust baseline characteristics for the one or more smart stationary batteries 130 and/or one or more remote smart stationary batteries 130. In some examples, these processes are executed by the battery health system 100 or one or components of the battery health system 100 illustrated in FIG. 1. One example of a process according to various aspects described herein is illustrated in FIGS. 6A and 6B. FIGS. 6A and 6B are described with continuing reference to at least FIGS. 1 and 2.

In various examples provided with respect to FIG. 6A, a process 600 may be executed by the local server 106, the cloud computing server 116, and/or the local server 110. For purposes of illustration, examples are provided with respect to the local server 106. However, in other embodiments, acts of the process 600 may be executed by the local server 110 and/or the cloud computing server 116 in addition to, or in lieu of, the local server 106.

Act 602 may optionally include receiving, by the local server 106, manufacturer specifications for a first smart stationary battery 130. In various examples, smart stationary battery manufacturers will run batteries through extensive testing before they are sold. On many occasions, this test data may be provided with the sale of a smart stationary battery. Often, this test data includes a number of data points, generated in a laboratory environment, that indicate how the smart stationary battery is likely to age based on calendar aging and cycle aging. For instance, a battery manufacturer may provide a number of sample data points in tabular form based on laboratory experiments for calendar life.

While helpful, this data may be limited and/or incomplete. Accordingly, in various examples, the battery health system 100 may use regression or interpolation to fill-in missing data and approximate aging affects for which there is no provided test data. For instance, for any given SoC, the battery health system 100 may use interpolation to estimate a calendar aging effect. In various examples, the battery health system 100 may apply high degree polynomials between data points to yield smooth curves and a more precise approximation for missing test data. In various examples, act 602 may only be executed once (for example, during a first execution of the process 600 by a server, such as the local server 106) to receive and/or interpolate the manufacturer specifications. For example, it may only be beneficial to receive and/or interpolate the manufacturer specifications once because the manufacturer specifications may be fixed at a time of manufacturing, and further receipt and/or interpolation may not yield any new information.

In act 604, the process 600 may include receiving, from the first smart stationary battery 130, operating conditions and/or operating characteristics of the first smart stationary battery 130. As previously discussed, the operating characteristics of a smart stationary battery 130 may include one or more characteristics of the performance of the smart stationary battery 130 during the operation of the smart stationary battery 130. For instance, operating characteristics may include, but are not limited to, one or more of duty cycles, DoD (for example, for each cycle), rate of discharge, rate of charge, and/or the general time stamping of a smart stationary battery 130 during operation, to name a few examples. Operating conditions, as also discussed herein, may include the one or more conditions of the smart stationary battery 130 (for example, temporal and/or environmental conditions) during the operation of the smart stationary battery 130. For instance, operating conditions may include battery temperature, cell temperature, duration of temperature or cell temperature, cycle timing during a temperature or cell temperature, date, and humidity, among other environmental factors.

In act 606, the process 600 may include storing the received operating conditions and operating characteristics. For instance, act 606 may include storing the received information at a battery health status database, such as database 108 coupled to the first local server 106. At act 608, the manufacturing specifications and the received operating information are transmitted to a server. For example, the local server 106 may transmit the manufacturing specifications and the received operating information to the cloud computing server 116. In some examples, such as examples in which the local server 106 has previously transmitted the manufacturing specifications to the cloud computing server 116, the local server 106 may only transmit the received operating information to the cloud computing server 116 at act 608. The process 600 may include storing the operating conditions and/or operating characteristics at the cloud computing server 116 (for example, at the cloud service database 118). In such an example, the process 600 may further include transmitting the operating conditions and/or operating characteristics from the first local server 106 to the cloud computer server 116, at which point, the received information is dispersed at stored at one or more cloud computing resources (act 610). Any of the foregoing examples of act 608 may be executed in connection with the local server 110 in addition to, or in lieu of, the cloud computing server 116.

In various examples, the battery health system 100 and related processes described herein provide the ability to use the data from deployed smart stationary batteries 130 to train one or more predictive models that predict how the smart stationary batteries 130 age. It is often a problem that one does not have sufficient lab or test data about a smart stationary battery's calendar/cycle aging effects to make an accurate prediction of the SoH of deployed smart stationary batteries 130. Accordingly, in many instances, battery manufacturers are conservative in providing baseline performance parameters. For example, some battery manufacturers may define the EoL of a battery as the point at which the battery has 80% of the original charge capacity. However, at 80% initial charge capacity, some smart stationary batteries may still have utility, and therefore, may be used about up to the point that the smart stationary battery has 40% of the original charge capacity.

Accordingly, in various examples, the process 600 may include one or more acts that include utilizing operating conditions and operating characteristics from a large installed base of smart stationary batteries 130 to retrain, on a continuous basis, the predictive models that predict cycle aging and calendar aging. This may, in turn, be used to update baseline characteristics for those smart stationary batteries 130. The updated baseline characteristics may subsequently be used in combination with operating information to generate an estimate of an estimated battery health status. In other examples, such predictive models may be used to provide information for operating conditions and operating characteristics that are not directly available for a particular smart stationary battery 130. Accordingly, baseline characteristics may be continually updated such that an estimated battery health status generated based on the baseline characteristics is increasingly more accurate.

In act 610, the process 600 may include determining an estimated battery health status of the first smart stationary battery 130 connected to the local server 106 based on the received operating conditions and the operating characteristics of the first smart stationary battery 130 and based on the stored baseline characteristics (for example, stored in the cloud computing server 118) The baseline characteristics produce an estimated battery health status based on specific input operating information. At act 612, the cloud computing server 116 transmits the estimated battery health status. For example, the cloud computing server 116 may transmit the estimated battery health status to the local server 106, or to a user as discussed above. In these examples, the local server 106 and/or the user may then have the advantage of an estimated battery health status generated based on the operating information and the baseline characteristics (for example, stored by the cloud computing server 118), which may be constantly updated by a predictive model.

Updating the baseline characteristics may be based on a comparison between an estimated battery health status and an actual battery health status. For example, and as discussed below with respect to a process 650 of FIG. 6B, the cloud computing server 116 may update the baseline characteristics if an actual battery health status for one or more batteries deviates from an estimated battery health status generated in accordance with FIG. 6A. Accordingly, in FIG. 6B, acts 602-610 may be executed in accordance with FIG. 6A and an estimated battery health status generated at act 610 may be utilized in the process 650.

At act 614 of the process 650, the local server 106 may receive actual health information from the smart stationary battery 130. The actual health information may include SoH data including, for example, depletion test data. At act 616, the local server 106 may determine, based on the actual health information, an actual battery health status of the smart stationary battery 130. At act 618, the local server 106 transmits the actual battery health status to the cloud computing server 116.

As discussed above, the estimated battery health status generated at act 610 may be utilized in the process 650. At act 620, the process 650 may include comparing the estimated battery health status and the actual battery health status of the first smart stationary battery 130. For example, the process 650 may be executed by the cloud computing server 116. If the estimated battery health status exceeds the actual battery health status, the process 650 may also include one or more optional acts of generating an alarm, notification, or other output (act 622). For example, an output indicative of the comparison may be provided to a user (for example, via a user interface of a user device) to notify the user of the deviation. In various examples, based on the comparison of the estimated battery health status and the actual battery health status of the first smart stationary battery 130, the process 650 may optionally include adjusting the baseline characteristics for the first smart stationary battery 130 (act 624). In some examples, the baseline characteristics may optionally be adjusted. For example, the baseline characteristics may only be adjusted if the estimated battery health status deviates from the actual battery health status by a specified and/or dynamically determined standard deviation.

In some examples, adjusting the baseline characteristics of a smart stationary battery 130 may include adjusting one or more models for cycle aging. If an update to the baseline characteristics is made at act 624, then at act 626 the baseline characteristics may be transmitted to the local server 106 and/or the local server 110, such that the local server 106 and/or the local server 110 may store the updated baseline characteristics in the databases 108 and/or 112 and the local servers 106, 110 may subsequently determine their own estimated battery health status. In other examples, an actual battery health status and/or the adjusted baseline characteristics may be transmitted to the local server 106 and/or the local server 110. That is, similar to act 610, the local servers 106, 110 may be able to determine, based on the operating information and locally stored baseline characteristics, an estimated battery health status. The cloud computing server 116 may be configured to transmit updated baseline characteristics each time the baseline characteristics are updated, periodically, aperiodically, responsive to user request, responsive to establishing a new connection session with the cloud computing server 116, or in response to any other conditions.

In various examples, any of the servers 106, 110, 116 may store the baseline characteristics prior to adjusting the baseline characteristics. For example, and as discussed above, the initial baseline characteristics may be based on manufacturer-supplied information. The servers 106, 110, 116 may store these initial baseline characteristics in any of the corresponding databases 108, 112, 118. The initial baseline characteristics may thus be subsequently accessible to the servers 106, 110, 116 for purposes including comparison to subsequently generated adjusted baseline characteristics, using the initial baseline characteristics to generate an estimated battery health status in addition to or in lieu of using the adjusted baseline characteristics, or another purpose.

In some examples, the calendar life of a smart stationary battery 130 defines how long the smart stationary battery 130 may be expected to last in time units of calendar years. Calendar life is independent of battery cycling, and may be largely influenced by the SoC of a smart stationary battery and operating temperatures. In most cases, UPS smart stationary batteries are maintained at a 100% SoC. Accordingly, in some examples, it may be assumed that the SoC for a smart stationary battery 130 is fixed at 100%.

UPS systems are bought and sold all over the globe and, as a result, are often exposed to highly variable operating conditions and operating characteristics. This variability can include different operating temperature ranges, different cycle counts depending on the reliability of the power in the region, and different depth of discharge. In a battery testing environment, the battery manufacturer is able to control operating conditions and characteristics. However, in deployment, operating conditions and operating characteristics may uncontrollably vary. Accordingly, in updating the baseline characteristics, the process 650 may include one or more acts that accurately update the predictive models based on real-time live information. For instance, actual battery health status averages may be used to update a predictive model, such that single statistical errors may not be sufficient to affect the predictive model. Specifically, operating conditions and operating characteristics for smart stationary batteries 130 in environments that are substantially unchanging may be used to build-up the predictive models based on the strength of the collected information. The predictive models may then be used to infer sensor data for environments that are very difficult, or impossible, to directly monitor.

For instance, act 604 may include receiving operating conditions and operating characteristics during a cycling process for the first smart stationary battery 130, (for example, either on a full or partial capacity) to capture the Full Charge Capacity (FCC) in Amp/Hrs. Aging effects for calendar aging and cycle aging may then be predicted and correlated to update baseline characteristics for that smart stationary battery 130, as long as those conditions remain in a state of relative stability over the course of the interval in question.

Acts of determining when there has been an underlying shift in the operating conditions or operating characteristics of the smart stationary battery 130 and predicting when and how long this change will last may also be included within process 650. Such acts may include updating a probabilistic model in real-time based on the received operating conditions and operating characteristics. Such acts may further include analysing weather data to predict weather events that would affect cycling, such as severe storms. For instance, using Bayes rule the process 650 may include computing multinomial distributions in real time, and determining the likelihood that the environment has changed for a sustained period of time. Such acts may allow updating the predictive models with the highest precision possible, while causing the least amount of disturbance to the smart stationary battery 130 by limiting the number of polls of the smart stationary battery 130.

In various examples, baseline characteristics adjustments may also include adjustments to a cycle aging predictive model. In particular, the predictive model of calendar aging may be used to isolate the effects of the cycle aging as evidence in the received operating conditions and operating characteristics. Updates to a predictive model of cycle aging using received operating conditions and operating characteristics for the first smart stationary battery 130 may be generalized over a number of cycles based on the manufacturer specifications. For instance, the process 650 may include counting the number of cycles, the DoD of each cycle, and the discharge rate. A manufacturer model may then be sampled to determine the predicted capacity fade. This regret is then allocated proportionally.

In various examples, act 624 of the process 650 may include executing supervised learning at one or more machine learning components that are configured to train the described predictive model or models. The machine learning component may be an artificial neural network, a Bayesian network, or other software or hardware component configured for regression analysis. Such a process and acts allow the generation of predictions based on past observations of calendar aging and cycle aging as a function of the operating conditions and operating characteristics.

One example implementation of executing supervised machine learning includes a regression analysis. In one example of the regression analysis, the hypothesis $h\theta_x$ of a single-feature model may be expressed as, $$h_\theta x = \theta_0 + \theta_1 x$$

with the cost function $J(\theta_0, \theta_1)$ for the corresponding parameters $\theta_0$ and $\theta_1$ being expressed as, $$J(\theta_0, \theta_1) = \frac{1}{2m} \sum_{i=1}^{m} (h_\theta x^i - y^i)^2$$

In one example, it may be advantageous to minimize the cost function. For example, the cost function may be minimized using a gradient descent method. The gradient descent method includes repeatedly computing a partial derivative of the cost function to minimize $\theta_0$ and $\theta_1$. That is, the partial derivative of the cost function may be repeatedly executed until a minimum value of the cost function is achieved. The gradient descent method may be expressed as, $$\theta_0 = \frac{\partial}{\partial \theta_0} J(\theta_0, \theta_1)$$

$$\theta_1 = \frac{\partial}{\partial \theta_1} J(\theta_0, \theta_1)$$

As noted above, the foregoing may apply to a single-feature model. In examples in which a regression curve is to be plotted with respect to multiple features (i.e., a multiple or multivariate linear regression model), then each parameter $\theta_j$ may be determined as, $$\theta_j := \theta_j - \alpha \frac{1}{2m} \sum_{i=1}^{m} (h_\theta x^{(i)} - y^{(i)}) x_j^{(i)}$$

Each parameter $\theta_j$ may be adjusted to achieve a best-possible fit. A set of features $x=\{x_1, x_2, \ldots x_n\}$ that may be adjusted may include any desired operating condition or characteristic information. For example, in the context of calendar aging, the principle independent variables may include temperature and SoC, while the dependent variable is a number of years until EoL. In another example, in the context of cycle aging, the independent variables may include DoD and rate of discharge, and the dependent variables may include a total number of cycles. A final model, which may form the basis of estimating a battery health status, may provide estimates as a function of all of the features $x=\{x_1, x_2, \ldots x_n\}$. Accordingly, values for calendar and cycle aging may be predicted by implementing functions for which baseline characteristics are continuously adjusted as additional operating characteristic information and operating condition information is received.

Acts 624 and 626 may include storing baseline characteristics, adjustments to baseline characteristics, and the baseline characteristics updates. For instance, the updated baseline characteristics may be stored at the battery health status database 108 coupled to the first local server 106, and/or the storage 214. However, in other examples, the process 650 may include storing this information at the cloud computing server 116 (for example, at the cloud service database 118). In such an example, the process 650 may further include transmitting the operating conditions and/or operating characteristics, baseline characteristics, and baseline characteristics adjustments from the first local server 106 to the cloud computing server 116, at which point, the received information is dispersed and stored at one or more cloud computing resources.

As previously discussed with reference to FIG. 1, in various examples, the battery health system 100 aggregates smart stationary battery logged sensor data from smart stationary battery networks as well as remote smart stationary battery networks. That is, in various examples, the battery health system 100 may pool data from most or all operating smart stationary batteries 130 having the same model, same version, and/or from the same manufacturing batch. Accordingly, the battery health status for more recently deployed smart stationary batteries 130 may be predicted based on the determined and previously adjusted baseline characteristics derived from older smart stationary batteries 130.

Accordingly, the process 650 may include receiving, from a remote smart stationary battery network, operating conditions and/or operating characteristics of one or more remote smart stationary batteries 130 (act 604). The process 650 may also include one or more acts of updating the baseline characteristics (act 624) for the first smart stationary battery 130 based at least in part on adjustments to baseline characteristics for another smart stationary battery 130. Similarly, the process 650 may include one or more acts of updating the baseline characteristics for another smart stationary battery 130 based at least in part on adjustments to baseline characteristics for the first smart stationary battery 130 (acts 624 and 626). In various examples, the process 650 may include various other acts and sub-processes, some of which are further described herein with reference to FIGS. 1-5.

As previously discussed, various examples of the battery health system 100 described herein may be used to detect defective smart stationary batteries 130, and in particular, one or more defects in battery cells. Accordingly, one example process for detecting a defective smart stationary battery 130 is described with continuing reference to the battery health system 100 of at least FIGS. 1 and 2. If a defective smart stationary battery 130 is detected, the battery health system 100 may perform one or more acts to guide a user through installing a replacement smart stationary battery. In other examples, the battery health system 100 may control the power device (for example, UPS) that is associated with the defective smart stationary battery 130 to avoid reliance on the smart stationary battery 130. For instance, this may include decoupling the defective smart stationary battery 130 from the DC bus of the UPS, or removing the defective smart stationary battery 130 from the UPS.

In various examples, manufacturer specifications (for example, manufacturer-specified performance parameters) are provided with a smart stationary battery 130. Accordingly, the smart stationary actual battery health status may be benchmarked against these manufacturer specifications to determine if one or more defects exist within that smart stationary battery 130. For instance, such a process may include deploying the smart stationary battery 130 within operating conditions and with operating characteristics that comply with manufacturer-specified use restrictions. The process may further include deploying a comparison smart stationary battery in the same operating conditions and with the same operating characteristics. The comparison smart stationary battery may be from a different manufacturing batch, but may have the same specified use restrictions. An estimated battery health status for the smart stationary battery 130 is determined (for example, as discussed herein), and an actual battery health status for the smart stationary battery 130 is also determined. An actual battery health status for the comparison smart stationary battery is also determined. If the actual battery health status of the smart stationary battery 130 is less than the anticipated battery health status, and the actual battery health status of the smart stationary battery 130 is less than the actual battery status of the comparison smart stationary battery, the battery health system 100 may identify the smart stationary battery 130 as being defective.

In various examples, the battery health system 100 described herein may also, or alternatively, detect misuse of a smart stationary battery 130. Accordingly, one example process for detecting battery misuse is described with continuing reference to the battery health system 100 of at least FIGS. 1 and 2. For instance, the battery health system 100 may detect operation of a smart stationary battery 130 outside of manufacturer use restrictions and/or warranty terms.

In various examples, manufacturer use restrictions and/or warranty terms are provided with a smart stationary battery 130. Accordingly, the smart stationary battery 130 actual health may be compared to these use restrictions and/or warranty terms to determine if the smart stationary battery 130 has been misused or used outside of the manufacturer use restrictions. Such a process may include determining the estimated battery health status of the smart stationary battery 130, and the actual battery health status of the smart stationary battery 130. If the estimated battery health status exceeds the actual battery health status, the process may then include reviewing the received operating conditions and the received operating characteristics. The operating conditions and/or operating characteristics may then be compared to the manufacturer use restrictions and/or warranty terms. If the defective performance (for example, estimated health status exceeds actual health status) correlates to a deviation from the manufacturer use restrictions (for example, evidenced by the operating conditions and/or operating characteristics), the battery health system 100 may determine that the smart stationary battery 130 has been misused. Such aspects may provide real-time smart stationary battery warranty validation functionality.

In some examples, an actual battery health status of a comparison smart stationary battery 130 may be determined where the comparison smart stationary battery 130 has operating information that indicates compliance with the manufacturer usage restrictions of the smart stationary battery 130, in order to validate the manufacturer usage restrictions. If the actual battery health status of the comparison smart stationary battery 130 exceeds the estimated battery health status of the smart stationary battery 130, then the manufacturer usage restrictions may be validated as correctly anticipating that a battery health status should be higher if the manufacturer usage restrictions are complied with.

Current UPS systems do not adjust baseline battery health characteristics or facilitate such adjustment. This is a technical problem. An exemplary embodiment of an uninterruptible power supply may comprise an interface that receives first sensor data indicative of operating information of the UPS's battery and second sensor data indicative of state-of-health characteristics of the battery from one or more sensors. The interface may be configured to communicate with a computer system that is coupled to a plurality of uninterruptible power supplies. The UPS may comprise a controller coupled the interface and configured to receive the first sensor data, provide the first sensor data to the computer system, and receive an estimated battery health status of the battery from the computer system. The estimated battery health status being based on the first sensor data and baseline battery health characteristics stored by the computer system. The controller may receive the second sensor data, determine an actual battery health status of the battery based on the second sensor data, compare the estimated battery health status and the actual battery health status of the battery, and communicate adjustment information to the computer system to adjust the baseline battery health characteristics based at least in part on the comparison of the estimated battery health status and the actual battery health status. At least this foregoing combination of features comprises a UPS design that serves as a technical solution to the foregoing technical problem. This technical solution is not routine, is unconventional, and is not well-understood in the field of UPS design and operation. This technical solution is a practical application of the exemplary UPS design that solves the foregoing technical problem and constitutes an improvement in the technical field of UPS design and operation at least by allowing a battery's health characteristics to be assessed with reference to baseline battery health characteristics that are adjusted based on a sensed actual battery health status, and communicating the adjustment information to a computer system so that the adjusted baseline can be used by other UPS systems.

Current systems do not adjust baseline battery health characteristics based on actual battery health data from a first battery and determine and output an estimated battery health status of a second battery based on the adjusted baseline. This is a technical problem. An exemplary embodiment of a system may comprise a processor configured to receive actual battery health data from a first power device, adjust stored baseline battery health characteristics based at least in part on the actual battery health status to generate adjusted stored baseline battery health characteristics, receive sensor data from a second power device, and determine and output an estimated battery health status of the second battery based on the sensor data and the adjusted stored baseline battery health characteristics. At least this foregoing combination of features comprises a system that serves as a technical solution to the foregoing technical problem. This technical solution is not routine, is unconventional, and is not well-understood in the field of power-device design and operation. This technical solution is a practical application of the exemplary system that solves the foregoing technical problem and constitutes an improvement in the technical field of power-device design and operation at least by allowing a second battery's health characteristics to be estimated with reference to baseline battery health characteristics that are adjusted based on a sensed actual battery health status of a first battery, and by allowing these estimated health characteristics to be output.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A non-transitory computer-readable medium storing thereon sequences of computer-executable instructions for controlling an uninterruptible power supply having a battery input to receive battery power from a battery and at least one interface configured to receive first sensor data indicative of operating information of the battery and second sensor data indicative of state-of-health characteristics of the battery from one or more sensors, the at least one interface being further configured to communicate with a computer system coupled to a plurality of uninterruptible power supplies, the sequences of computer-executable instructions including instructions that instruct at least one processor to:

receive the first sensor data from the one or more sensors;
provide the first sensor data to the computer system;
receive an estimated battery health status of the battery from the computer system, the estimated battery health status being calculated based on the first sensor data and baseline battery health characteristics stored by the computer system, wherein the estimated battery health status is a calculated estimation of a current state-of-health of the battery;
receive the second sensor data from the one or more sensors;
determine an actual battery health status of the battery based on the second sensor data;
compare the estimated battery health status and the actual battery health status of the battery; and
communicate adjustment information to the computer system to adjust the baseline battery health characteristics based at least in part on the comparison of the estimated battery health status and the actual battery health status.

2. The non-transitory computer-readable medium of claim 1, wherein the estimated battery health status includes an estimated remaining charge capacity of the battery and the actual battery health status includes an actual remaining charge capacity of the battery, and wherein the at least one processor is further configured to generate an output if the estimated remaining charge capacity exceeds the actual remaining charge capacity.

3. The non-transitory computer-readable medium of claim 1, wherein the at least one processor is further configured to provide manufacturer specification information corresponding to the battery to the computer system.

4. The non-transitory computer-readable medium of claim 3, wherein the manufacturer specification information includes an estimated calendar life and an estimated cycle life.

5. The non-transitory computer-readable medium of claim 1, wherein the operating information includes at least one of current characteristics, voltage characteristics, power characteristics, duty cycle characteristics, depth of discharge characteristics, rate of discharge characteristics, or rate of charge characteristics.

6. The non-transitory computer-readable medium of claim 1, wherein the operating information includes one or more of battery temperature characteristics, battery cell temperature characteristics, cycle timing characteristics, or humidity characteristics.

7. The non-transitory computer-readable medium of claim 1, wherein the estimated battery health status of the battery includes an estimated remaining life.

8. The non-transitory computer-readable medium of claim 1, wherein the second sensor data includes depletion test information.

9. A method of controlling an uninterruptible power supply having a battery input to receive battery power from a battery and at least one interface configured to receive first sensor data indicative of operating information of the battery and second sensor data indicative of state-of-health characteristics of the battery from one or more sensors, the at least one interface being further configured to communicate with a computer system coupled to a plurality of uninterruptible power supplies, the method comprising:

receiving the first sensor data from the one or more sensors;
providing the first sensor data to the computer system;
receiving an estimated battery health status of the battery from the computer system, the estimated battery health status being calculated based on the first sensor data and baseline battery health characteristics stored by the computer system, wherein the estimated battery health status is a calculated estimation of a current state-of-health of the battery;
receiving the second sensor data from the one or more sensors;
determining an actual battery health status of the battery based on the second sensor data;
comparing the estimated battery health status and the actual battery health status of the battery; and
communicating adjustment information to the computer system to adjust the baseline battery health characteristics based at least in part on the comparison of the estimated battery health status and the actual battery health status.

10. The method of claim 9, wherein the estimated battery health status includes an estimated remaining charge capacity of the battery and the actual battery health status includes an actual remaining charge capacity of the battery, the method further comprising generating an output responsive to determining that the estimated remaining charge capacity exceeds the actual remaining charge capacity.

11. The method of claim 9, further comprising providing manufacturer specification information corresponding to the battery to the computer system.

12. The method of claim 11, wherein the manufacturer specification information includes an estimated calendar life and an estimated cycle life.

13. The method of claim 9, wherein the operating information includes at least one of current characteristics, voltage characteristics, power characteristics, duty cycle characteristics, depth of discharge characteristics, rate of discharge characteristics, or rate of charge characteristics.

14. The method of claim 9, wherein the operating information includes one or more of battery temperature characteristics, battery cell temperature characteristics, cycle timing characteristics, or humidity characteristics.

15. The method of claim 9, wherein the estimated battery health status of the battery includes an estimated remaining life.

16. The method of claim 9, wherein the second sensor data includes depletion test information.

17. A method of controlling a computer system configured to be communicatively coupled to a plurality of power devices each being configured to be coupled to a respective battery, the method comprising:
receiving actual battery health data from a first power device of the plurality of power devices, the actual battery health data being indicative of an actual battery health status of a first battery coupled to the first power device;
adjusting stored baseline battery health characteristics based at least in part on the actual battery health status to generate adjusted stored baseline battery health characteristics;
receiving sensor data from a second power device of the plurality of power devices, the sensor data being indicative of operating information of a second battery coupled to the second power device;
determining an estimated battery health status of the second battery based on the sensor data and the adjusted stored baseline battery health characteristics, wherein the estimated battery health status includes a calculated estimation of a current state-of-health of the second battery; and
outputting the estimated battery health status of the second battery.

18. The method of claim 17, wherein adjusting the stored baseline battery health characteristics includes:
receiving second sensor data from the first power device, the second sensor data being indicative of operating information of the first battery; and
determining an estimated battery health status of the first battery based on the second sensor data and the stored baseline battery health characteristics;
wherein generating the adjusted stored baseline battery health characteristics is based on a difference between the estimated battery health status of the first battery and the actual battery health data.

19. The method of claim 18, wherein the estimated battery health status of the first battery includes an estimated remaining charge capacity of the first battery and the actual battery health status includes an actual remaining charge capacity of the first battery, the method further comprising generating an output responsive to determining that the estimated remaining charge capacity of the first battery exceeds the actual remaining charge capacity of the first battery.

20. The method of claim 17, further comprising:
receiving second actual battery health data from the second power device, the second actual battery health data being indicative of an actual battery health status of the second battery;
comparing the actual battery health status of the second battery to the estimated battery health status of the second battery to determine whether the actual battery health status of the second battery is less than the estimated battery health status of the second battery; and
generating an output indicative of the actual battery health status of the second battery being less than the estimated battery health status of the second battery.

21. The method of claim 20, the method further comprising
comparing, responsive to determining that the actual battery health status of the second battery is less than the estimated battery health status of the second battery, the actual battery health status of the first battery to the actual battery health status of the second battery to determine whether the actual battery health status of the second battery is less than the actual battery health status of the first battery; and
generating an output indicative of the actual battery health status of the second battery being less than the actual battery health status of the first battery.

22. The method of claim 21, the method further comprising
determining, responsive to determining that the actual battery health status of the second battery is less than the actual battery health status of the first battery, that the second battery is defective; and
generating, based on the determination that the second battery is defective, an output indicative of the second battery being defective.

23. The method of claim 20, the method further comprising:
determining, responsive to determining that the actual battery health status of the second battery is less than the estimated battery health status of the second battery, whether the operating information of the second battery complies with manufacturer usage restrictions for the second battery; and generating an output indicating that the operating information of the second battery does not comply with the manufacturer usage restrictions for the second battery.

24. The method of claim 23, the method further comprising:

comparing, responsive to determining that the operating information of the second battery does not comply with the manufacturer usage restrictions for the second battery, the actual battery health status of the first battery to the actual battery health status of the second battery to validate the manufacturer usage restrictions for the second battery, wherein operating information of the first battery complies with the manufacturer usage restrictions for the second battery; and generating, responsive to validating the manufacturer usage restrictions for the second battery, an output indicating that the actual battery health status of the second battery is less than the estimated battery health status of the second battery due to the operating information of the second battery not complying with the manufacturer usage restrictions for the second battery.

* * * * *